United States Patent
Kamiya et al.

(10) Patent No.: US 9,470,977 B2
(45) Date of Patent: *Oct. 18, 2016

(54) COMPOSITION FOR LITHOGRAPHIC PRINTING PLATE AND LITHOGRAPHIC PRINTING PLATE PRECURSOR

(71) Applicant: Eastman Kodak Company, Rochester, NY (US)

(72) Inventors: Masamichi Kamiya, Oura-gun (JP); Yasuhiro Asawa, Ota (JP); Akira Igarashi, Kumagaya (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/422,221

(22) PCT Filed: Sep. 27, 2013

(86) PCT No.: PCT/JP2013/077019
§ 371 (c)(1),
(2) Date: Feb. 18, 2015

(87) PCT Pub. No.: WO2014/061463
PCT Pub. Date: Apr. 24, 2014

(65) Prior Publication Data
US 2015/0198884 A1    Jul. 16, 2015

(30) Foreign Application Priority Data
Oct. 17, 2012   (JP) .................................. 2012-229633

(51) Int. Cl.
| | | |
|---|---|---|
| G03F 7/00 | (2006.01) |
| G03F 7/038 | (2006.01) |
| B41C 1/10 | (2006.01) |
| C08F 220/28 | (2006.01) |
| C08F 222/40 | (2006.01) |
| C08F 265/06 | (2006.01) |
| C08F 267/10 | (2006.01) |
| G03F 7/004 | (2006.01) |

(52) U.S. Cl.
CPC .......... *G03F 7/0388* (2013.01); *B41C 1/1008* (2013.01); *C08F 220/28* (2013.01); *C08F 222/40* (2013.01); *C08F 265/06* (2013.01); *C08F 267/10* (2013.01); *G03F 7/038* (2013.01); *B41C 2210/06* (2013.01); *B41C 2210/24* (2013.01); *C08F 2220/286* (2013.01); *C08F 2220/287* (2013.01); *C08F 2222/402* (2013.01); *G03F 7/0046* (2013.01)

(58) Field of Classification Search
CPC ........................................................ B41C 1/10
See application file for complete search history.

(56) References Cited

U.S. PATENT DOCUMENTS

2013/0196268 A1*  8/2013  Hayashi ................. G03F 7/029
                                                        430/286.1

* cited by examiner

*Primary Examiner* — Chanceity Robinson
(74) *Attorney, Agent, or Firm* — J. Lanny Tucker

(57) ABSTRACT

The present invention has an objective of providing a composition for a lithographic printing plate, which provides an image-forming layer exhibiting superior ink receptivity and uniformity, and in which a coating solution containing the composition possesses a good defoaming property and can effectively form an image-forming layer at high speed. In addition, the present invention has another objective of providing a lithographic printing plate precursor or a dummy plate which can be produced at high speed with superior production efficacy. The present invention provides a composition for a lithographic printing plate containing a fluoroaliphatic group-containing copolymer having a specific chemical structure, the lithographic printing plate precursor or a dummy plate containing a layer having the aforementioned composition.

14 Claims, No Drawings

COMPOSITION FOR LITHOGRAPHIC PRINTING PLATE AND LITHOGRAPHIC PRINTING PLATE PRECURSOR

TECHNICAL FIELD

The present invention relates to a composition for a lithographic-printing plate. More particularly, the present invention relates to a composition for suitable use in an infrared-sensitive or heat-sensitive lithographic-printing plate which is used as a so-called computer-to-plate (CTP) plate capable of directly recording images by irradiation with infrared rays from a solid laser or a semiconductor laser corresponding to digital signals. The present invention also relates to a lithographic printing plate precursor and a dummy lithographic printing plate using the composition.

BACKGROUND ART

With the progress of computer image-processing techniques, a method of directly recording images on a photosensitive layer by irradiation corresponding to digital signals has recently been developed. Therefore, an intense interest has been shown toward a computer-to-plate (CTP) system in which images are directly formed on a photosensitive lithographic printing plate precursor, without outputting onto a silver salt mask film, by employing the method for a lithographic printing plate. The CTP system, which uses a high-output laser having a maximum intensity within a near infrared or infrared range as a light source for the irradiation, has, for example, the following advantages: images having high resolution can be obtained by exposure within a short time and the lithographic printing plate precursor used for the system can be handled in daylight. Regarding solid and semiconductor lasers capable of emitting infrared rays having a wavelength of 760 nm to 1,200 nm, a high-output and portable laser is available with ease.

As a lithographic printing plate precursor which can form images using a solid laser or semiconductor laser, JP-A-2002-296774, JP-A-2002-311577, and JP-A-2007-17948 disclose a lithographic printing plate precursor comprising a substrate and an image-recording layer provided thereon, in which the image-recording layer comprises a specific polymer having a perfluoroalkyl group.

DISCLOSURE OF INVENTION

The lithographic printing plate precursor in which a specific polymer having a perfluoroalkyl group is blended in the image-recording layer, as disclosed in JP-A-2002-296774, JP-A-2002-311577, and JP-A-2007-17948 can exhibit superior ink receptivity and can also improve uniformity of an image-forming layer, as compared with the case of blending none of the aforementioned polymer.

However, a composition comprising the aforementioned polymer having a perfluoroalkyl group has a deteriorated defoaming property. For this reason, when an image-forming layer is formed on a substrate by using the aforementioned composition, air bubbles easily remain in or on the aforementioned layer. This tendency remarkably occurs in the case of obtaining an image-forming layer by applying the aforementioned composition at high speed on the substrate in order to enhance production efficiency. The remaining air bubbles cause various problems. For example, the air bubbles present in or on the image-forming layer may cause defects such as streaks, white spots and the like in the image. The rate of application of the composition cannot be increased in order to control air bubbles. A problem causing reduction of the production efficiency thereby may occur not only in the case of forming an image-forming layer, but also in the case of forming a non-photosensitive protecting layer on the image-forming layer, as well as, in the case of forming a non-photosensitive protecting layer on a substrate of a dummy plate which is fit on the part requiring no printing of a plate cylinder of a printing machine.

The present invention was completed in view of the aforementioned circumstances, and has an objective of providing a composition for a lithographic printing plate which can provide an image-forming layer exhibiting superior ink receptivity and uniformity, and in addition, can effectively form an image-forming layer at high speed since the composition possesses a good defoaming property.

In addition, the present invention has another objective of providing a lithographic printing plate precursor which can be produced at high speed with superior production efficiency, and a dummy plate.

The above objective of the present invention can be achieved by:

a composition for a lithographic printing plate, comprising:

a fluoroaliphatic group-containing copolymer having at least a unit represented by the following general formula:

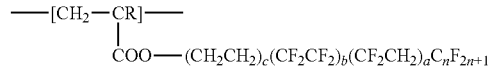

wherein
R denotes a hydrogen atom or a methyl group;
n denotes an integer from 1 to 6;
a denotes an integer from 1 to 4;
b denotes an integer from 1 to 3; and
c denotes an integer from 1 to 3.

The above fluoroaliphatic group-containing copolymer preferably further has a unit corresponding to poly(oxyalkylene) acrylate and/or poly(oxyalkylene) methacrylate.

The above fluoroaliphatic group-containing copolymer may further have a unit having an acidic hydrogen atom.

The above fluoroaliphatic group-containing copolymer may further have a unit having an ethylenically unsaturated group in a side chain.

The composition for a lithographic printing plate, according to the present invention, can be photosensitive or non-photosensitive.

In addition, the present invention also relates to a lithographic printing plate precursor, comprising: a substrate; and an image-forming layer comprising the aforementioned composition for a lithographic printing plate on the substrate. The above image-forming layer may comprise a plurality of layers.

The image-forming layer of the lithographic printing plate precursor of the present invention can comprise a photo-thermal convertor.

The image-forming layer of the lithographic printing plate precursor of the present invention can further comprise a water-insoluble and alkaline aqueous solution-soluble or alkaline aqueous solution-dispersible resin, in addition to the photo-thermal convertor. In this case, the image-forming layer may further comprise an acid generator.

The image-forming layer of the lithographic printing plate precursor of the present invention can further comprise a polymerization initiator and a radical-polymerizable compound, in addition to the photo-thermal convertor.

The image-forming layer of the lithographic printing plate precursor of the present invention can comprise a photo-polymerization initiator and an ethylenically unsaturated bond-containing compound in spite of the presence or absence of the photo-thermal convertor.

In the case of the composition for a lithographic printing plate according to the present invention being non-photosensitive, the lithographic printing plate precursor of the present invention may comprise a protecting layer comprising a non-photosensitive composition for a lithographic printing plate on the image-forming layer.

In addition, the present invention also relates to a dummy lithographic printing plate, comprising: a substrate; and a protecting layer comprising the non-photosensitive composition for a lithographic printing plate according to the present invention, provided on the substrate.

The compositions for lithographic printing plates of the present invention can provide image-forming layers having superior ink receptivity and uniformity, and can also effectively form image-forming layers with good defoaming properties at high speed.

In addition, the image-forming layer(s) obtained by use of the composition for lithographic printing plate of the present invention can exhibit superior ink receptivity, as compared with the image-forming layer(s) obtained by use of a composition including a polymer with conventional perfluoroalkyl groups.

In addition, the lithographic printing plate precursors of the present invention and the dummy plates of the present invention can accelerate a rate of forming each of layers on a substrate. For this reason, they can be produced at high speed with superior production efficacy.

BEST MODE FOR CARRYING OUT THE INVENTION

The composition for a lithographic printing plate of the present invention, comprises at least: a fluoroaliphatic group-containing copolymer having at least a unit represented by the following general formula:

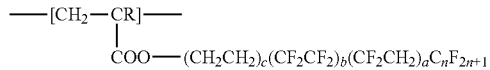

wherein
R denotes a hydrogen atom or a methyl group;
n denotes an integer ranging from 1 to 6, and preferably an integer ranging from 2 to 4;
a denotes an integer ranging from 1 to 4, and preferably an integer ranging from 1 to 2;
b denotes an integer ranging from 1 to 3, and preferably an integer ranging from 1 to 2; and
c denotes an integer ranging from 1 to 3.

The aforementioned fluoroaliphatic group-containing copolymer can be produced by copolymerizing a monomer represented by the following general formula (I):

wherein R, n, a, b and c are the same as defined above, with another radical polymerizable monomer. Therefore, the aforementioned fluoroaliphatic group-containing copolymer contains the units corresponding to the monomer represented by the aforementioned general formula (I) and the units corresponding to another radical polymerizable monomer.

The monomer represented by the aforementioned general formula (I) has a perfluoroalkyl group having 6 or less carbon atoms which is low in bioaccumulation potential. For this reason, the monomer has low toxicity in the human body. In addition, the monomer easily forms a double bond by elimination of HF from the $CH_2CF_2$ moiety in the molecule. The formed double bond is easily decomposed by ozonolysis, and for this reason, properties of deterioration of environment are reduced. Therefore, use of the monomer represented by the aforementioned general formula (I) is good for both the users and the environment.

The aforementioned monomer represented by the aforementioned general formula (I) can be produced by subjecting a fluoroalkyl alcohol represented by the following general formula (II):

$$C_nF_{2n+1}(CH_2CF_2)_a(CF_2CF_2)_b(CH_2CH_2)_cOH \qquad (II)$$

wherein n, a, b and c are the same as defined above,
to an esterification reaction with (meth)acrylic acid. Here, the aforementioned (meth)acrylic acid denotes acrylic acid or methacrylic acid. The fluoroalkyl alcohol represented by the aforementioned general formula (II) is produced, for example, from a corresponding fluoroalkyl iodide.

The fluoroalkyl iodide which is the starting material for the synthesis of the fluoroalkyl alcohol represented by the aforementioned general formula (II) is represented by the following general formula (III):

$$C_nF_{2n+1}(CH_2CF_2)_a(CF_2CF_2)_b(CH_2CH_2)_cI \qquad (III)$$

wherein n, a, b and c are the same as defined above.

The fluoroalkyl iodide represented by the aforementioned general formula (III) can be produced by an addition reaction of ethylene to a terminally iodinated compound represented by the following general formula (IV):

$$C_nF_{2n+1}(CH_2CF_2)_a(CF_2CF_2)_bI \qquad (IV)$$

wherein n, a and b are the same as defined above.

The addition reaction of ethylene is carried out by adding pressurized ethylene to the compound represented by the aforementioned general formula (IV) in the presence of a peroxide initiator. The addition number of ethylene depends on the reaction conditions, but is one or more, preferably ranges from one to three, and is more preferably one. The addition reaction is affected by the decomposition temperature of an initiator used, but is usually carried out at the reaction temperature ranging from about 80° C. to 120° C. In the case of using a peroxide initiator that is decomposed at a low temperature, the reaction can be carried out at 80° C. or lower. Examples of the peroxide initiator include tertiary butyl peroxide, di(tertiary-butyl cyclohexyl) peroxydicarbonate, dicetyl peroxydicarbonate, di-n-propyl peroxydicarbonate, diisopropyl peroxydicarbonate, or di-secondary-butyl peroxydicarbonate. In view of progression properties and controlling properties of the reaction, the peroxide initiator is preferably used in a ratio ranging from about 1% by mol to 5% by mol with respect to the compound represented by the aforementioned general formula (IV).

The compound represented by the aforementioned general formula (IV) can be synthesized via the following series of steps:
(i) A perfluoroalkyl iodide represented by the following general formula (V):

$$C_nF_{2n+1}I \qquad (V)$$

wherein n is the same as defined above, is subjected to a reaction with vinylidene fluoride in the presence of the peroxide initiator as described above (in a usage amount ranging from about 0.1% by mol to 0.5% by mol with respect to the raw material compound) to give a compound (b=0) represented by the following general formula (VI):

$$C_nF_{2n+1}(CH_2CF_2)_aI \quad (VI)$$

wherein n and a are the same as defined above, (ii) In addition, tetrafluoroethylene is reacted with the compound represented by the aforementioned general formula (VI) in the presence of a peroxide initiator, if necessary. Thereby, a terminally iodinated compound represented by the aforementioned general formula (IV) can be obtained. As the peroxide initiator used in the reaction of step (ii), the organic peroxide initiator as described above is preferably used, and the usage ratio thereof is preferably the same as described in step (i).

The reaction temperature of the addition reaction of vinylidene fluoride (and tetrafluoroethylene, if necessary) is affected by the decomposition temperature of the initiator used, but a reaction at a temperature of 80° C. or lower can be carried out even under a low-pressure condition by using a peroxide initiator that is decomposed at a low temperature. The reaction is carried out as follows: The compound represented by the aforementioned general formula (V) or (VI) is placed in an autoclave; the inner temperature of the autoclave is increased to about 10° C. to 60° C., for example, to 50° C.; then a peroxide initiator dissolved in the compound represented by the aforementioned general formula (V) or (VI) is added thereto; and when the inner temperature is increased to, for example, 55° C., a desired amount of vinylidene fluoride or tetrafluoroethylene is fractionally added while maintaining a pressure ranging from about 0.1 to 1.0 MPa; and then aging is performed within a temperature ranging, for example, from about 55° C. to 80° C. for about 1 hour. The number, a, of the vinylidene fluoride skeleton and the number, b, of the tetrafluoroethylene skeleton added by the reaction depend on the addition amounts thereof. In general, the products are formed as a mixture of those having various a values and b values.

These reactions are carried out at relatively low temperatures. Thereby, not only a reduction in energy consumption, but also controlling of corrosion due to hydrofluoric acid or the like, can be achieved, and thereby, the frequency of renewal of the facilities can be reduced. In addition, more inexpensive materials can be used, and for this reason, in conjunction with the reduction in frequency of renewal, the investment cost for facilities can be reduced.

Examples of the specific compounds represented by the aforementioned general formula (IV) to which ethylene is added include the compounds shown below. These compounds are mixtures of oligomers having various a values and b values, and an oligomer having the specific a value and b value can be isolated by distilling the mixture. Oligomers which do not have the specific a value and b value can be, after isolation or directly as the mixture, used again in a reaction with vinylidene fluoride or tetrafluoroethylene for increasing the oligomerization number.

$CF_3(CH_2CF_2)I$
$C_2F_5(CH_2CF_2)I$
$C_2F_5(CH_2CF_2)_2I$
$C_3F_7(CH_2CF_2)I$
$C_3F_7(CH_2CF_2)_2I$
$C_4F_9(CH_2CF_2)I$
$C_4F_9(CH_2CF_2)_2I$
$C_2F_5(CH_2CF_2)(CF_2CF_2)I$
$C_2F_5(CH_2CF_2)(CF_2CF_2)_2I$
$C_2F_5(CH_2CF_2)_2(CF_2CF_2)I$
$C_2F_5(CH_2CF_2)_2(CF_2CF_2)_2I$
$C_4F_9(CH_2CF_2)(CF_2CF_2)I$
$C_4F_9(CH_2CF_2)_2(CF_2CF_2)I$
$C_4F_9(CH_2CF_2)(CF_2CF_2)_2I$
$C_4F_9(CH_2CF_2)_2(CF_2CF_2)_2I$

The fluoroalkyl alcohol represented by the aforementioned general formula (II) can be produced by, first, subjecting a fluoroalkyl iodide of the aforementioned general formula (III) to a reaction with N-methyl formamide $HCONH(CH_3)$ to prepare a mixture of a fluoroalkyl alcohol and a formate thereof, and subsequently, subjecting the mixture to hydrolysis in the presence of an acid catalyst. In this reaction, in order to prevent reduction of the yield caused by occurrences of elimination of HF from $CH_2CF_2$ derived from vinylidene fluoride combined in the fluoroalkyl iodide, N-methyl formamide is preferably used in about 5 to 10 times molar amount, and an aqueous solution of p-toluenesulfonic acid is preferably used as an acid catalyst. The reaction with N-methyl formamide can be carried out for about 4 to 5 hours at about 140° C. to 160° C. The subsequent hydrolysis can be carried for about 7 to 8 hours at about 70° C. to 90° C.

The obtained fluoroalkyl alcohol represented by the aforementioned general formula (II) can be esterified by (meth) acrylic acid to form a monomer represented by the aforementioned general formula (I). In the esterification, first, an aromatic hydrocarbon solvent such as toluene or benzene, a catalyst such as p-toluenesulfonic acid, and hydroquinone serving as a polymerization inhibitor are added to the fluoroalkyl alcohol of the aforementioned general formula (II), and the mixture is heated at about 90° C. to 100° C. Subsequently, about 1 to 2 times molar amount of (meth) acrylic acid is added thereto, and the mixture is heated at about 110° C. to 120° C. for about 2 to 5 hours for dehydration. The esterification is preferably carried out as described above.

As the aforementioned another radical polymerizable monomer, any monomer of a polymerizable fluorine atom-containing monomer and a polymerizable fluorine atom-free monomer can be used. When a polymerizable fluorine atom-containing monomer is used, the polyfluoroalkyl group, and preferably the perfluoroalkyl group, of the monomer can preferably have 1 to 6 carbon atoms, and more preferably have 2 to 4 carbon atoms.

As the polymerizable fluorine-atom-containing monomer, for example, one represented by the following general formula can be used:

$$CH_2=CRCOOR_1-(NR_2SO_2)_m-Rf$$

wherein
R denotes a hydrogen atom or a methyl group,
$R_1$ denotes a divalent organic group, and preferably an alkylene group or a polyfluoroalkylene group having 1 to 4 carbon atoms,
$R_2$ denotes a lower alkyl group having 1 to 5 carbon atoms,
Rf denotes a polyfluoroalkyl group, and preferably a perfluoroalkyl group, having 1 to 6 carbon atoms, and preferably having 2 to 4 carbon atoms, and
m denotes 0 or 1.

For example, the polyfluoroalkyl group-containing (meth) acrylate monomers shown below can be used. The number n of the carbon atoms of the terminal polyfluoroalkyl group preferably ranges from 1 to 6. When the $R_1$ group is a polyfluoroalkylene group and m is 0, the number of carbon atoms as the total with that of the terminal polyfluoroalkyl group preferably ranges from 1 to 6.

$CH_2=CHCOOCH_2C_nF_{2n}H$
$CH_2=C(CH_3)COOCH_2C_nF_{2n}H$
$CH_2=CHCOOCH_2C_nF_{2n+1}$
$CH_2=C(CH_3)COOCH_2C_nF_{2n+1}$
$CH_2=CHCOOC_2H_4C_nF_{2n+1}$
$CH_2=C(CH_3)COOC_2H_4C_nF_{2n+1}$
$CH_2=CHCOOC_3H_6C_nF_{2n+1}$
$CH_2=C(CH_3)COOC_3H_6C_nF_{2n+1}$
$CH_2=CHCOOC_4H_8C_nF_{2n+1}$
$CH_2=C(CH_3)COOC_4H_8C_nF_{2n+1}$
$CH_2=CHCOOC_2H_4N(CH_3)SO_2C_nF_{2n+1}$
$CH_2=C(CH_3)COOC_2H_4N(CH_3)SO_2C_nF_{2n+1}$
$CH_2=CHCOOC_2H_4N(C_2H_5)SO_2C_nF_{2n+1}$
$CH_2=C(CH_3)COOC_2H_4N(C_2H_5)SO_2C_nF_{2n+1}$
$CH_2=CHCOOC_2H_4N(C_3H_7)SO_2C_nF_{2n+1}$
$CH_2=C(CH_3)COOC_2H_4N(C_3H_7)SO_2C_nF_{2n+1}$
$CH_2=CHCOOC_2H_4C_nF_{2n}CF(CF_3)_2$
$CH_2=C(CH_3)COOC_2H_4C_nF_{2n}CF(CF_3)_2$ wherein n is the same as defined above.

In addition, preferable examples of the polymerizable fluorine atom-free monomer include (meth)acrylic acid esters represented by the following general formula:

$$R_3OCOCR=CH_2$$

wherein
R denotes a hydrogen atom or a methyl group,
$R_3$ denotes an alkyl group, an alkoxyalkyl group, a cycloalkyl group, an aryl group, or an aralkyl group.

Examples of the aforementioned (meth) acrylic acid esters include acrylic acid esters or methacrylic acid esters obtained by esterification with an alkyl group such as methyl, ethyl, propyl, isopropyl, n-butyl, n-hexyl, 2-ethylhexyl, n-octyl, lauryl, or stearyl; an alkoxyalkyl group such as methoxymethyl, 2-methoxyethyl, 2-ethoxyethyl, 2-butoxyethyl, or 3-ethoxypropyl; a cycloalkyl group such as cyclohexyl, an aryl group such as phenyl; or an aralkyl group such as benzyl. In addition, monoalkyl esters or dialkyl esters of fumaric acid or maleic acid, such as monomethyl, dimethyl, monoethyl, diethyl, monopropyl, dipropyl, monobutyl, dibutyl, mono-2-ethylhexyl, di-2-ethylhexyl, monooctyl, or dioctyl esters thereof; and vinyl esters such as vinyl acetate or vinyl caprylate, can also be used. More preferred esters are alkyl (meth)acrylate having a long chain alkyl group having 8 or more carbon atoms, for example, an alkyl group such as 2-ethylhexyl, n-octyl, lauryl, or stearyl; a cycloalkyl group such as cyclohexyl or an aralkyl group such as benzyl. In particular, stearyl (meth)acrylate and benzyl (meth)acrylate are preferably used. Here, (meth)acrylate denotes acrylate or methacrylate.

In addition, as the aforementioned polymerizable fluorine atom-free monomer, poly(oxyalkylene) acrylate and/or poly(oxyalkylene) methacrylate can also be used.

The polyoxyalkylene group can be represented by the following formula: $(OR')_x$, wherein R' denotes an alkylene group having 2 to 4 carbon atoms and preferably —$CH_2CH_2$—, —$CH_2CH_2CH_2$—, —$CH(CH_3)CH_2$—, —$CH_2CH_2CH_2CH_2$— or —$CH(CH_3)CH(CH_3)$—. x is a positive integer. The oxyalkylene units present in the aforementioned poly(oxyalkylene) group may be composed of only the same oxyalkylene units as in the poly(oxypropylene), or may be composed of at least two different oxyalkylene units regularly or randomly linked together such as a group comprising an oxypropylene unit and oxyethylene unit linked together.

The terminal atom or group of the poly(oxyalkylene) chain may be a hydrogen atom or any other group, but is preferably a hydrogen atom, an alkyl group (preferably having 1 to 20 carbon atoms), an allyl group (preferably having 2 to 20 carbon atoms) or an aryl group (preferably having 6 to 10 carbon atoms). The aryl group may have a substituent such as an alkyl group (for example, that having 1 to 10 carbon atoms) or a halogen atom. The poly(oxyalkylene) chain may be one linked through one or more chains (such as —CONN-Ph-NHCO— (wherein Ph denotes a phenylene group) or —S—). The chain-bonding site may have a valence of 3 or higher to form a branched chain-like oxyalkylene unit. The molecular weight of the poly(oxyalkylene) group including the chain-bonding site preferably ranges from 250 to 3,000.

Poly(oxyalkylene) acrylate and methacrylate can be prepared by reacting commercially available hydroxy poly(oxyalkylene) materials such as those sold under the trade name of "Pluronic" (manufactured by Asahi Denka Kogyo K.K.), "Adeka Polyether" (manufactured by Asahi Denka Kogyo K.K.), "Carbowax" (manufactured by Glyco Products), "Toriton" (manufactured by Rohm and Haas Company) and P.E.G. (manufactured by Dai-ichi Kogyo Seiyaku Co., Ltd.) with acrylic acid, methacrylic acid, acryl chloride, methacryl chloride or acrylic acid anhydride according to any known method. Alternatively, it is also possible to use a poly(oxyalkylene) diacrylate prepared according to the known method.

Examples of commercially available monomers include polyoxyalkylene glycol mono(meth)acrylate having a terminal hydroxyl group manufactured by Nippon Oil and Fats Co., Ltd., such as Blemmer PE-90, Blemmer PE-200, Blemmer PE-350, Blemmer AE-90, Blemmer AE-200, Blemmer AE-400, Blemmer PP-1000, Blemmer PP-500, Blemmer PP-800, Blemmer AP-150, Blemmer AP-400, Blemmer AP-550, Blemmer AP-800, Blemmer 50PEP-300, Blemmer 70PEP-350B, Blemmer AEP Series, Blemmer 55PEP-400, Blemmer 30PEP-800, Blemmer 55PEP-800, Blemmer AET Series, Blemmer 30PPT-800, Blemmer 50PPT-800, Blemmer 70PPT-800, Blemmer APT Series, Blemmer 10PPB-500B and Blemmer 10APB-500B. Examples of commercially available monomers also include polyalkylene glycol mono(meth)acrylate having a terminal alkyl group manufactured by Nippon Oil and Fats Co., Ltd., such as Blemmer PME-100, Blemmer PME-200, Blemmer PME-400, Blemmer PME-1000, Blemmer PME-4000, Blemmer AME-400, Blemmer 50POEP-800B, Blemmer 50AOEP-800B, Blemmer PLE-200, Blemmer ALE-200, Blemmer ALE-800, Blemmer PSE-400, Blemmer PSE-1300, Blemmer ASEP Series, Blemmer PKEP Series, Blemmer AKEP Series, Blemmer ANE-300, Blemmer ANE-1300, Blemmer PNEP Series, Blemmer PNPE Series, Blemmer 43ANEP-500 and Blemmer 70ANEP-550; and Light Ester MC, Light Ester 130MA, Light Ester 041 MA, Light Acrylate BO-A, Light Acrylate EC-A, Light Acrylate MTG-A, Light Acrylate 130A, Light Acrylate DMP-A, Light Acrylate P-200A, Light Acrylate NP-4EA and Light Acrylate NP-8EA, manufactured by Kyoeisha Chemical Co., Ltd.

The aforementioned fluoroaliphatic group-containing copolymer may further have a unit having an acidic hydrogen atom. Examples of the acidic hydrogen atom include a phenolic hydroxyl group, a carboxyl group, —$SO_2NH_2$, —$SO_2NH$—, —$CONHCO$—, —$COCH_2CO$—, —$SO_2NHCO$—, —$CONHSO_2NH$—, —$SO_2NHSO_2$—, —$SO_3H$ and the like. In particular, the acidic hydrogen atom derived from the phenolic hydroxyl group or the carboxyl group is preferable.

The unit having an acidic hydrogen atom can be introduced in the aforementioned fluoroaliphatic group-containing copolymer by copolymerization of a polymerizable monomer having an acidic hydrogen atom. The polymerizable monomer having an acidic hydrogen atom is not particularly limited. Examples thereof include, for example, (meth)acrylic acid and addition-polymerizable unsaturated compounds having a phenolic hydroxyl group, and compounds such as $CH_2=C(R)-CO-X_1-R_4-SO_2NH-R_5$, and $CH_2=C(R)-CO-X_2-R_6-NHSO_2-R_7$. In the aforementioned formulae, R is the same as defined above; each of $X_1$ and $X_2$ independently denotes —O— or —$NR_8$—; each of $R_4$ and $R_6$ independently denotes a substituted or unsubstituted $C_1$-$C_{12}$ alkylene, cycloalkylene, arylene or aralkylene group; $R_5$ denotes a hydrogen atom, or a substituted or unsubstituted $C_1$-$C_{12}$ alkyl, cycloalkyl, aryl or aralkyl group; $R_7$ denotes a substituted or unsubstituted $C_1$-$C_{12}$ alkyl, cycloalkyl, aryl or aralkyl group; and $R_8$ denotes a hydrogen atom or a substituted or unsubstituted $C_1$-$C_{12}$ alkyl, cycloalkyl, aryl or aralkyl group.

The aforementioned fluoroaliphatic group-containing copolymer may further comprise a unit having an ethylenically unsaturated group in a side chain. Examples of methods for introducing an ethylenically unsaturated group in a side chain include, for example, a method in which a monomer represented by the aforementioned general formula (I), (meth)acrylate or (meth)acrylic acid having a hydroxyl group, or (meth)acrylate having a glycidyl group, and, if necessary, an addition-polymerizable unsaturated compound as described below are copolymerized, and (meth)acryloyl isocyanate, glycidyl (meth)acrylate, or (meth)acrylic acid is respectively reacted to the hydroxyl group, the carboxyl group, or the glycidyl group of the side chain of the obtained polymer; a method in which a monomer represented by the aforementioned general formula (I) and maleic anhydride are copolymerized, (meth)acrylate having a hydroxyl group or allyl alcohol is reacted with the obtained polymer; and the like. In addition, a method in which allyl chloride, allyl glycidyl ether or the like is reacted with a carboxyl group of the side chain of the polymer, may also be mentioned. Here, as an example of a (meth)acrylate having a hydroxyl group, for example, the aforementioned ones may be mentioned, and as an example of a (meth)acrylate having a glycidyl group, for example, glycidyl (meth)acrylate may be mentioned.

In addition, examples of the aforementioned fluorine atom-free copolymerizable monomer include ethylene, styrene, vinylidene chloride, vinyl chloride, vinyl fluoride, vinylidene fluoride, vinyl toluene, alpha-methylstyrene, p-methylstyrene, vinyl naphthalene, acrylonitrile, methacrylonitrile, isoprene, pentadiene, butadiene, chloroprene, vinyl alkyl ether, halogenated alkyl vinyl ether, vinyl alkyl ketone, aziridinylethyl (meth)acrylate, aziridinyl (meth)acrylate, polysiloxane-containing (meth)acrylate, triallyl (iso)cyanurate, allyl glycidyl ether, allyl acetate, N-vinyl carbazole, maleimide; N-alkyl maleimide such as N-methyl maleimide, N-lauryl maleimide, N-cyclohexyl maleimide or the like; N-aryl maleimide such as N-phenyl maleimide or the like; (2-dimethylamino)ethyl (meth)acrylate, side-chain silicon-containing (meth)acrylate, urethane bond-containing (meth)acrylate, hydroxyethyl vinyl ether, hydroxybutyl vinyl ether, and the like.

In addition, in accordance with need, a polyfunctional monomer or oligomer can also be used as the aforementioned fluorine atom-free polymerizable monomer. Examples of the polyfunctional monomer or oligomer include ethylene glycol di(meth)acrylate, propylene glycol di(meth)acrylate, 1,4-butanediol di(meth)acrylate, 1,6-hexanediol di(meth)acrylate, 1,9-nonanediol di(meth)acrylate, neopentylglycol di(meth)acrylate, tetraethylene glycol di(meth)acrylate, tripropylene glycol di(meth)acrylate, polypropylene glycol di(meth)acrylate, bisphenol A-ethylene oxide adduct diacrylate, dimethylol tricyclodecane diacrylate, glycerin methacrylate acrylate, 3-acryloyloxy glycerin monomethacrylate, and the like.

As the aforementioned fluorine atom-free polymerizable monomer, a cross-linkable group-containing monomer, such as (meth)acrylamide, N-methylol (meth)acrylamide, N-methoxymethyl acrylamide, N,N-dimethyl (meth)acrylamide, N-butoxymethyl acrylamide, diacetone (meth)acrylamide, methylolated diacetone (meth)acrylamide, or glycidyl (meth)acrylate, can also be used. By copolymerizing the cross-linkable group-containing monomer, durability of, for example, an image-forming layer of a lithographic printing plate precursor can be enhanced. Here, (meth)acrylamide denotes acrylamide or methacrylamide.

In order to obtain the fluoroaliphatic group-containing copolymer used in the present invention, the monomer represented by the aforementioned general formula (I) is preferably copolymerized at a rate of 5% by weight or more, preferably 10% by weight or more, more preferably 15% by weight or more, further preferably 20% by weight or more, further preferably 25% by weight or more, and further preferably 30% by weight or more, based on the weight of all the monomers. The aforementioned other radical polymerizable monomer is preferably copolymerized at a rate of 95% by weight or less, preferably 90% by weight or less, more preferably 85% by weight or less, further preferably 80% by weight or less, further preferably 75% by weight or less, and further preferably 70% by weight or less, based on the weight of all the monomers.

When the fluoroaliphatic group-containing copolymer used in the present invention is produced by copolymerizing the monomer represented by the aforementioned general formula (I) with the other radical-polymerizable monomer, conventionally known radical polymerization in the art is preferably carried out.

The radical-polymerization reaction is preferably carried out by reacting the monomer represented by the aforementioned general formula (I) and the other radical polymerizable monomer in a fluorine atom-containing organic solvent such as 1,4-bis(trifluoromethyl)benzene, 1,1,1,2,2-pentafluoro-3,3-dichloropropane, 1,1,2,2,3-pentafluoro-1,3-dichloropropane, 1,1,1,2,3,4,4,5,5,5-decafluoropentane, or perfluorohexane or in a fluorine atom-free organic solvent such as methyl isobutyl ketone, or acetic ester, in the presence of an azo compound such as azobisisobutyronitrile, or an organic peroxide such as bis(4-tertiary butyl cyclohexyl) peroxydicarbonate, di-n-propyl peroxydicarbonate, or diisopropyl peroxydicarbonate, as a radical polymerization initiator, in a rate ranging from 1 to 20% by weight, preferably 2 to 10% by weight with respect to the polymerizable monomers, for about 1 hour to 10 hours at about 40° C. to 100° C.

The copolymerization reaction of the monomer represented by the aforementioned general formula (I) and the other radical-polymerizable monomer is not limited to the solution polymerization method as described above. For example, an emulsion polymerization method in which water is used as a dispersion medium and a nonionic surfactant and/or a cationic surfactant are/is used, or a suspension polymerization method can also be used.

The fluoroaliphatic group-containing copolymer obtained as described above can be separated from the reaction system by means of a method of evaporation to dryness, or a method of aggregation by adding an aggregating agent such as an inorganic salt, and subsequently, purified by means of cleansing with a solvent. The weight-average molecular weight Mw of the obtained copolymer can be measured by means of high-performance liquid chromatography, and can range from about 2,000 to 200,000, depending on the polymerization conditions.

The fluoroaliphatic group-containing copolymer obtained by a solution polymerization method is preferably used by diluting with the aforementioned various organic solvents, and preferably the same organic solvent as that used in the polymerization reaction so that the concentration of the solid content ranges from about 0.01 to 50% by weight and preferably ranges from about 0.005 to 25% by weight. On the other hand, the copolymer obtained by an emulsion polymerization method or a suspension polymerization method can also be used as it is, or as an aqueous dispersion after diluting with water so that the concentration of the solid content ranges from, for example, about 0.1 to 50% by weight, or as an aqueous dispersion or a solution with an organic solvent obtained by adding an aggregating agent to the polymerization reaction mixture to aggregate the copolymer, washing with water or an organic solvent, and dispersing the separated copolymer in water or dissolving the separated copolymer in an organic solvent. An aqueous dispersion obtained by preferably containing a surfactant and a water-soluble organic solvent in an amount of 20% by weight or less is used.

The composition of the present invention comprises the fluoroaliphatic group-containing copolymer obtained as described above. The content of the fluoroaliphatic group-containing copolymer is not particularly limited. The content can range from 0.0001 to 50% by weight, preferably ranges from 0.001 to 30% by weight, more preferably ranges from 0.01 to 20% by weight, and more preferably ranges from 0.1 to 10% by weight, based on the total weight of the composition.

The composition for a lithographic printing plate of the present invention may be photosensitive or non-photosensitive.

The composition for a lithographic printing plate of the present invention can be used for forming an image-forming layer (photosensitive layer) of a lithographic printing plate precursor (photosensitive lithographic printing plate). Therefore, the lithographic printing plate precursor of the present invention can comprise an image-forming layer containing the composition for a lithographic printing plate of the present invention, provided on a substrate.

Examples of the lithographic printing plate precursor of the present invention include, for example, a lithographic printing plate precursor in which an image-forming layer possesses infrared sensitivity, such as one having a maximum absorption wavelength within a range from 760 nm to 1,200 nm. In particular, a thermal positive type, a thermal negative type, a photopolymer type, and a processless type described below are preferable. Therefore, the composition for a lithographic printing plate of the present invention can comprise components for forming an image-forming layer, in accordance with each of the aforementioned types.

Hereinafter, the aforementioned preferable lithographic printing plate precursors are described.

Thermal Positive Type

A thermal positive type of image-forming layer preferably contains a photo-thermal convertor and a water-insoluble and alkaline aqueous solution-soluble or dispersible resin.

In order to enable the resin to be soluble or dispersible in the alkaline aqueous solution, the resin preferably has at least one functional group such as a phenolic hydroxyl group, a carboxyl group, a sulfonic acid group, a phosphoric acid group, an imide group and an amide group. Therefore, the resin, which is water-insoluble but soluble or dispersible in the alkaline aqueous solution, can be preferably produced by polymerizing a monomer mixture containing at least one ethylenically unsaturated monomer having a functional group such as a phenolic hydroxyl group, a carboxyl group, a sulfonic acid group, a phosphoric acid group, an imide group, an amide group, or a combination thereof.

The ethylenically unsaturated monomer may be a compound represented by the following formula:

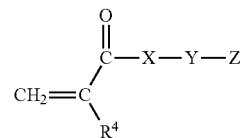

wherein
R$^4$ represents a hydrogen atom, a C$_{1-22}$ linear, branched or cyclic alkyl group, a C$_{1-22}$ linear, branched or cyclic substituted alkyl group, or a C$_{6-24}$ aryl or substituted aryl group, the substituent being selected from a C$_{1-4}$ alkyl group, an aryl group, a halogen atom, a keto group, an ester group, an alkoxy group and a cyano group;
X represents O, S or NR$^5$, wherein R$^5$ represents a hydrogen atom, a C$_{1-22}$ linear, branched or cyclic alkyl group, a C$_{1-22}$ linear, branched or cyclic substituted alkyl group or a C$_{6-24}$ aryl group or substituted aryl group, the substituent being selected from a C$_{1-4}$ alkyl group, an aryl group, a halogen atom, a keto group, an ester group, an alkoxy group and a cyano group; Y represents a single bond, or a C$_{1-22}$ linear, branched or cyclic alkylene, alkyleneoxyalkylene, poly(alkyleneoxy)alkylene or alkylene-NHCONH—;
Z represents a hydrogen atom, a hydroxy group, carboxylic acid, —C$_6$H$_4$—SO$_2$NH$_2$, —C$_6$H$_3$—SO$_2$NH$_2$(—OH), or a group represented by the following formula:

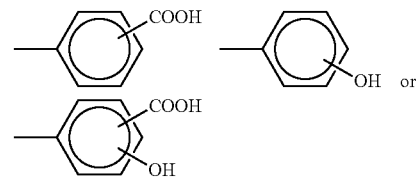

or a mixture thereof.

Examples of the ethylenically unsaturated monomer include, in addition to acrylic acid and methacrylic acid, compounds represented by the following formulae and a mixture thereof.

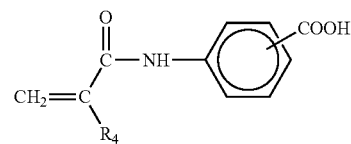

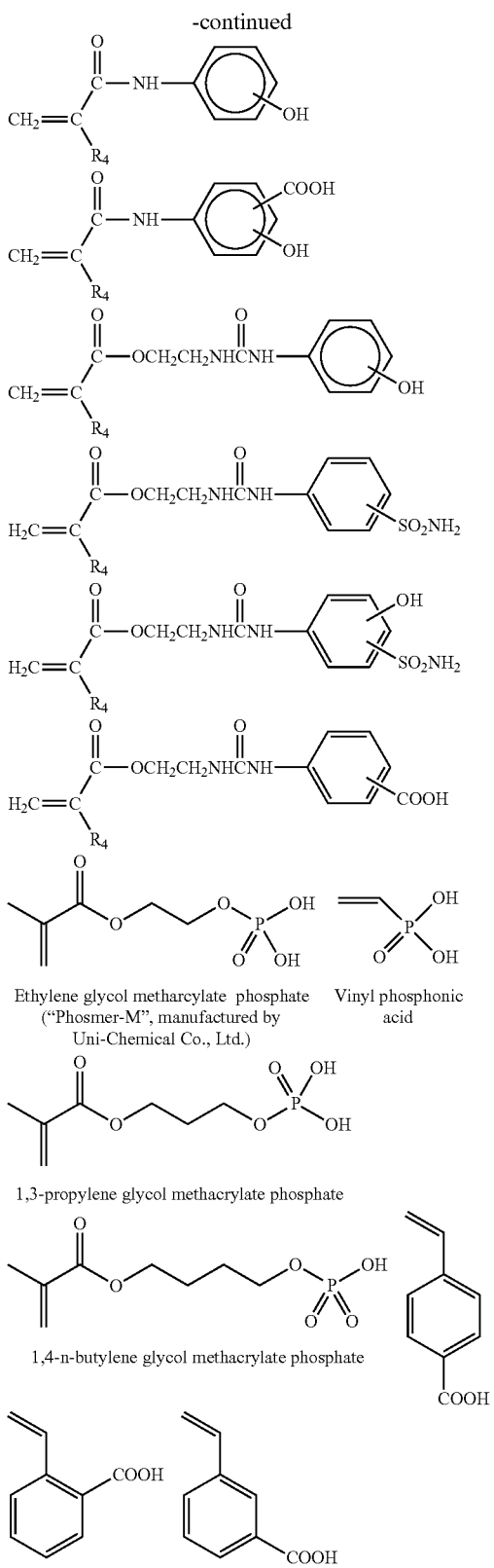

The monomer mixture may contain another ethylenically unsaturated comonomer. Examples of another ethylenically unsaturated comonomer include the following monomers: acrylate esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate and tetrahydroacrylate;

aryl acrylates such as phenyl acrylate and furfuryl acrylate;

methacrylate esters such as methyl methacrylate, ethyl methacrylate, propyl methacrylate, isopropyl methacrylate, allyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate;

aryl methacrylates such as phenyl methacrylate, cresyl methacrylate and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide and N-benzylacrylamide;

N-arylacrylamides such as N-phenylacrylamide, N-tolylacrylamide, N-nitrophenylacrylamide, N-naphthylacrylamide and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide and N,N-dicyclohexylacrylamide;

N,N-arylacrylamides such as N-methyl-N-phenylacrylamide, N-hydroxyethyl-N-methylacrylamide and N-2-acetamideethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate, and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl 2,4-dichlorophenyl ether, vinyl naphthyl ether and vinyl anthranyl ether;

vinyl esters such as vinyl butyrate, vinyl isobutyrate, vinyltrimethyl acetate, vinyldiethyl acetate, vinyl valerate, vinyl caproate, vinylchloro acetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene and 4-fluoro-3-trifluoromethylstyrene;

crotonic esters such as butyl crotonate, hexyl crotonate, crotonic acid and glycerin monocrotonate;

dialkyl itaconates such as dimethyl itaconate, diethyl itaconate and dibutyl itaconate;

dialkyls of maleic acid or fumaric acid, such as dimethyl fumarate and dibutyl fumarate;

maleimides such as N-methyhnaleimide, N-ethylmaleimide, N-propylmaleimide, N-butylmaleimide, N-phenylmaleimide, N-2-methylphenylmaleimide, N-2,6-diethylphenylmaleimide, N-2-chlorophenymaleimide, N-cyclohexylmaleimide, N-laurylmaleimide and N-hydroxyphenylmaleimide; and nitrogen atom-containing monomers such as N-vinylpyrrolidone, N-vinylpyridine, acrylonitrile and methacrylonitrile.

Among these other ethylenically unsaturated comonomers, for example, (meth)acrylate esters, (meth)acrylamides, maleimides and (meth)acrylonitriles are preferably used.

The weight-average molecular weight of the water-insoluble and alkaline aqueous solution-soluble or dispersible resin preferably ranges from 2,000 to 100,000, more preferably ranges from 5,000 to 50,000 and further more preferably ranges from 12,000 to 40,000. When the weight-average molecular weight of the water-insoluble and alkaline aqueous solution-soluble or dispersible resin is less than 2,000, the solvent durability or abrasion resistance thereof may tend to be poor. On the other hand, when the weight-average molecular weight of the water-insoluble and alkaline aqueous solution-soluble or dispersible resin is more than 100,000, alkaline developing properties thereof may tend to be poor.

The content of the water-insoluble and alkaline aqueous solution-soluble or dispersible resin is preferably within a range from 1 to 90% by weight, more preferably from 3 to 80% by weight, and further more preferably from 5 to 70% by weight, based on the total weight of the solid content in the image-forming layer. If necessary, two or more kinds of the water-insoluble and alkaline aqueous solution-soluble or dispersible resins may be used in combination.

The term "photo-thermal convertor (photo-thermal converting material)" in the specification means any material capable of converting electromagnetic waves into thermal energy and is a material having a maximum absorption wavelength within the near infrared or infrared range, for example, a material having a maximum absorption wavelength within a range from 760 nm to 1,200 nm. Examples of such a material include various pigments and dyes.

The pigments used in the present invention are commercially available pigments described, for example, in Color Index Handbook, "Latest Pigment Handbook" (edited by Nihon Pigment Technique Society, published in 1977), "Latest Pigment Application Technique" (published by CMC in 1986), and "Printing Ink Technique" (published by CMC in 1984). Applicable types of pigments include black, yellow, orange, brown, red, violet, blue and green pigments, fluorescent pigments and polymer-grafted dyes. For example, insoluble azo pigments, azo lake pigments, condensed azo pigments, chelated azo pigments, phthalocyanine pigments, anthraquinone pigments, perylene and perinone pigments, thiomindigo pigments, quinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black can be used.

Among these pigments, carbon black is preferably used as a material which efficiently absorbs light in the near infrared or infrared range and is also economically excellent. As the carbon black, grafted carbon blacks having various functional groups, which are excellent in dispersibility, are commercially available and examples thereof include those described on page 167 of "The Carbon Black, Handbook, 3rd edition" (edited by the Carbon Black Society of Japan and issued in 1995) and those described on page 111 of "Characteristics, Optimum Blending and Applied Technique of Carbon Black" (edited by Technical Information Society in 1997), all of which are preferably used in the present invention.

These pigments may be used without carrying out a surface treatment, or may be used after being subjected to a surface treatment. As a method of the surface treatment, a method of surface-coating a resin or a wax, a method of attaching a surfactant, and a method of binding a reactive substance (such as a silane coupling agent, an epoxy compound, a polyisocyanate or the like) to the surface of a pigment can be considered. The aforementioned surface treating methods are described in "Property and Application of Metal Soap" (Saiwai Shobou), "Printing Ink Technique" (published by CMC in 1984) and "Latest Pigment Application Technique" (published by CMC in 1986). The particle size of these pigments preferably ranges from 0.01 to 15 μm, and more preferably ranges from 0.01 to 5 μm.

The dyes used in the present invention are conventionally known commercially available dyes described, for example, in "Dye Handbook" (edited by the Association of Organic Synthesis Chemistry, published in 1970), "Handbook of Color Material Engineering" (edited by the Japan Society of Color Material, Asakura Shoten K. K., published in 1989), "Technologies and Markets of Industrial Dyes" (published by CMC in 1983), and "Chemical Handbook, Applied Chemistry Edition" (edited by The Chemical Society of Japan, Maruzen Shoten K. K., published in 1986). Specific examples of the dyes include azo dyes, azo dyes in the form of metal complex salts, pyrazolone azo dyes, anthraquinone dyes, phthalocyanine dyes, carbonium dyes, quinoneimine dyes, methine dyes, cyanine dyes, indigo dyes, quinoline dyes, nitro-based dyes, xanthene-based dyes, thiazine-based dyes, azine dyes, and oxazine dyes.

As the dyes capable of efficiently absorbing near infrared rays or infrared rays, for example, dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts and metal thiolate complexes (for example, nickel thioate complexes) can be used. Among these, cyanine dyes are preferable, and cyanine dyes represented by the general formula (I) of JP-A-2001-305722 and compounds described in paragraphs [0096] to [0103] of JP-A-2002-079772 can be exemplified.

The photo-thermal convertors are particularly preferably dyes represented by the following formulae:

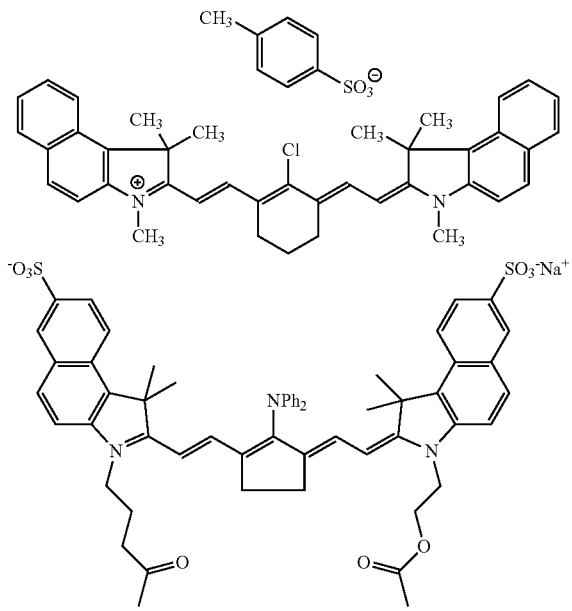

wherein Ph represents a phenyl group.

The photo-thermal convertor can be added in the image-forming layer in an amount within the range from 0.001 to 20% by mass (weight), preferably from 0.01 to 10% by mass (weight), and particularly preferably from 0.1 to 6% by mass (weight), based on the solid content of the image-forming layer. When the amount is less than 0.001% by mass (weight), sensitivity may decrease. On the other hand, when the amount is more than 20% by mass (weight), the non-image area may be contaminated during printing. These photo-thermal convertors may be used alone or in combination.

The image-forming layer may be a single layer or alternatively, may be composed of multiple layers. In the case of the image-forming layer composed of multiple layers, the composition of the present invention can be contained in any one or more layers of the aforementioned multiple layers.

Thermal Negative Type

An image-forming layer of thermal negative type is a negative type photosensitive layer, in which when exposed with infrared laser, the radiated areas are cured to form image areas. A preferred example of such a thermal negative type photosensitive layer is a polymerizable type layer (hereinafter referred to as a "polymerizable layer"). The polymerizable layer contains (A) an infrared absorber, (B) a radical generator (radical polymerization initiator), (C) a radical polymerizable compound which undergoes a polymerization reaction due to generated radicals so as to be cured, and (D) a binder polymer.

In the polymerizable layer, infrared light which the infrared absorber absorbs is converted to heat, and the heat generated at this time causes the radical polymerization initiator such as an onium salt to be decomposed, so as to generate radicals. The radical polymerizable compound is selected from compounds having a terminal ethylenically unsaturated bond, and undergoes a polymerization chain reaction due to the generated radicals, so that the compound is cured.

The infrared absorber (A) is, for example, the aforementioned photo-thermal convertor contained in the aforementioned thermal positive type photosensitive layer. Specific examples of the cyanine dye include dyes described in paragraphs [0017] to [0019] in JP-A-2001-133969 (Japanese Unexamined Patent Application, First Publication (Kokai) No. 2001-133969).

The radical generator (B) is, for example, an onium salt. Specific examples of the onium salt which is preferably used include salts described in paragraphs [0030] to [0033] in JP-A-2001-133969.

The radical polymerizable compound (C) is selected from compounds having one or more, and preferably two or more terminal ethylenically unsaturated bonds.

The binder polymer (D) is preferably a linear organic polymer, and is selected from linear organic polymers soluble or swellable in water or alkalescent water. In particular, among these polymers, (meth)acryl resins having a benzyl group or an allyl group, and a carboxyl group on the side chain are preferable because the resin is excellent in balance of film strength, sensitivity and developing property.

As the radical polymerizable compound (C) and the binder polymer (D), materials described in paragraphs [0036] to [0060] in JP-A-2001-133969 can be used. As other additives, additives (for example, a surfactant for improving coatability) described in paragraphs [0061] to [0068] in JP-A-2001-133969 are preferably used.

A preferred example of the thermal negative type photosensitive layer is an acid-crosslinkable type layer (referred to as an "acid-crosslinkable layer" hereinafter) besides the polymerizing type layer. The acid-crosslinkable layer preferably contains (E) a compound which can generate an acid due to light or heat (referred to as an "acid generator" hereinafter), and (F) a compound which can be crosslinked by the generated acid (referred to as a "crosslinking agent"), and further contains (G) an alkali-soluble polymer compound which can react with the crosslinking agent in the presence of the acid. In order to use the energy of an infrared laser effectively, the infrared absorber (A) is incorporated into the acid-crosslinkable layer.

The acid generator (E) may be a compound which can be thermally decomposed to generate an acid, and examples thereof include a photo initiator for photopolymerization, a photo alterant for dyes, an acid generator used in micro-resists, such as 3-diazo-4-methoxydiphenylamine trifluoromethane sulfonate.

Examples of the crosslinking agent (F) include (i) an aromatic compound substituted with a hydroxymethyl group or an alkoxymethyl group, (ii) a compound having an N-hydroxymethyl group, an N-alkoxymethyl group or an N-acyloxymethyl group, and (iii) an epoxy compound.

Examples of the alkali-soluble polymer compound (G) include a novolak resin and a polymer having a hydroxyaryl group on the side chain.

The image-forming layer may be a single layer or may be composed of multiple layers. In the case of the image-forming layer composed of multiple layers, the composition of the present invention can be contained in any one or more layers of the aforementioned multiple layers.

Photopolymer Type

A photopolymer type photosensitive layer is formed of a photopolymerizable photosensitive composition (referred to as a "photopolymerizable composition" hereinafter) and contains an ethylenically unsaturated bond-containing compound which is addition-polymerizable (referred to merely as an "ethylenically unsaturated bond-containing compound" hereinafter), a photopolymerization initiator and a polymer binder as essential components and optionally contains various compounds such as a colorant, a plasticizer, and a thermopolymerization inhibitor.

The ethylenically unsaturated bond-containing compound is a compound having an ethylenically unsaturated bond which is addition-polymerized, crosslinked and cured by an action of the photopolymerization initiator when the photopolymerizable composition is irradiated with active rays. The ethylenically unsaturated bond-containing compound can be arbitrarily selected from compounds having at least one terminal ethylenically unsaturated bond, preferably two or more terminal ethylenically unsaturated bonds, and takes the chemical morphology of a monomer, a prepolymer (that is, a dimer, a timer, or an oligomer), a mixture thereof or a copolymer thereof, or in some other chemical morphology. Examples of the monomer include an ester of an unsaturated carboxylic acid (such as acrylic acid, methacrylic acid, itaconic acid, crotonic acid, isocrotonic acid or maleic acid) with an aliphatic polyhydric alcohol compound, and an amide of an unsaturated carboxylic acid with an aliphatic polyhydric amine compound. Urethane-based addition-polymerizable compounds are also preferred.

The photopolymerization initiator can be appropriately selected from various photopolymerization initiators and combination systems of two or more photopolymerization initiators (photo initiator systems), depending on the wavelength of the infrared light source used. For example, initiator systems described in paragraphs [0021] to [0023] in JP-A-2001-22079 (Japanese Unexamined Patent Publication (Kokai) No. 2001-22079) are preferred.

As the polymer binder, alkali water-soluble or -swellable organic polymers are used because the binder, which functions as an agent for forming the film of the photopolymerizable composition, must cause the dissolution of the photosensitive layer in an alkali developer. As the polymers, polymers described in JP-A-2001-22079 are useful. It is also preferred to add, additives (for example, a surfactant for improving coatability) disclosed in paragraphs [0079] to [0088] in the same publication (JP-A-2001-22079) to the photopolymerizable composition.

In order to prevent the polymerization inhibiting action of oxygen, it is also preferred to provide an oxygen-blocking protective layer on or over the photosensitive layer. Examples of the polymer contained in the oxygen-blocking protective layer are polyvinyl alcohol and copolymers thereof Processless Type An image-forming layer of the processless type includes a thermoplastic fine particle polymer type, a microcapsule type, and a sulfonic acid-generating polymer containing type, in addition to the aforementioned photopolymer type. The present invention is particularly suitable for a processless type which is developed on a printing machine.

—Thermoplastic Fine Particle Polymer Type—

In the thermoplastic fine particle polymer type, hydrophobic heat-meltable resin fine particles (H) are dispersed in a hydrophilic polymer matrix (J), and the hydrophobic polymer is melted by heat at the infrared ray-exposed areas, so that the melted polymer areas are fused to each other. As a result, hydrophobic portions made of the polymer, namely, image areas are formed. The hydrophobic heat-meltable resin fine particles (H) (referred to as "polymer fine particles" hereinafter) are preferably melted and combined with each other by heat, and the particles are more preferably particles which have hydrophilic surfaces and can be dispersed in a hydrophilic component such as dampening water.

Preferred examples of the polymer fine particles include thermoplastic polymer fine particles described in Research Disclosure No. 33303 (January in 1992), JP-A-H09-123387, JP-A-H09-131850, JP-A-H09-171249 and JP-A-H09-171250, EP No. 931,647, and the like. Specific examples thereof include homopolymers and copolymers of monomers such as ethylene, styrene, vinyl chloride, methyl acrylate, ethyl acrylate, methyl methacrylate, ethyl methacrylate, vinylidene chloride, acrylonitrile, and vinyl carbazole; and mixtures thereof. Particularly preferred are polystyrene and polymethyl methacrylate.

The polymer fine particles having hydrophilic surfaces include, as examples thereof, substances in which polymers are themselves hydrophilic, such as substances in which polymers constituting fine particles are themselves hydrophilic, or substances to which hydrophilicity is imparted by introducing hydrophilic groups such as carboxylic acid anion, sulfonic acid anion, sulfuric acid anion, phosphonic acid anion, or phosphoric acid anion, into the main chains or side chains of polymers; and substances whose surfaces are made hydrophilic by allowing a hydrophilic polymer, a hydrophilic oligomer or a hydrophilic low-molecular-weight compound, such as polyvinyl alcohol or polyethylene glycol, to be adsorbed on the surfaces of the polymer fine particles. As the polymer fine particles, polymer fine particles having reactive functional groups are more preferred. By dispersing polymer fine particles as described above into the hydrophilic polymer matrix (J), the on-press developing properties are made better in the case of on-press development and further the film strength of the photosensitive layer itself is also improved.

—Microcapsule Type—

Preferred examples of the microcapsule type include a type described in JP-A-2000-118160; and a microcapsule type in which a compound having a thermally reactive functional group is encapsulated as described in JP-A-2001-277740.

—Sulfonic Acid-Generating Polymer Containing Type—

Examples of the sulfonic acid-generating polymer include polymers having, on the side chains thereof, sulfonic acid ester groups, disulfonic groups or sec- or tert-sulfonamide groups, described in JP-A-H10-282672.

By incorporating a hydrophilic resin into the processless type photosensitive layer, the on-press developing properties are improved and, further, the film strength of the photosensitive layer itself is also improved. Moreover, the hydrophilic resin can be crosslinked and cured. Thereby, a lithographic printing plate precursor for which no development treatment is required can be obtained.

Preferred examples of the hydrophilic resin include a resin having a hydrophilic group such as a hydroxyl group, a carboxyl group, a hydroxyethyl group, a hydroxypropyl group, an amino group, an aminoethyl group, an aminopropyl group, or a carboxylmethyl group; and a hydrophilic sol-gel convertible binder resin. Specific examples of the hydrophilic resin are the same as described as examples of the hydrophilic resin used as the hydrophilic polymer matrix (J) which is used in the photo polymer type photosensitive layer. In the processless type photosensitive layer, it is preferred to use the sol-gel convertible binder resin among the hydrophilic resins.

It is necessary to add a photo-thermal convertor to the processless type photosensitive layer. The photo-thermal convertor may be any material which can absorb light having a wavelength of 700 nm or more. Particularly preferred are the same dyes which can absorb infrared rays as used in the aforementioned thermal positive type.

The image-forming layer of the lithographic printing plate precursor of the present invention can be formed by applying the composition for a lithographic printing plate of the present invention, onto a substrate or onto a base layer optionally provided on the substrate.

The composition for a lithographic printing plate of the present invention is provided for use by dissolving in various solvents when the composition is applied. Examples of the solvent used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolatone, and toluene. When using a water-soluble photosensitive layer, examples of the solvent include an aqueous solvent such as water and an alcohol. However, the solvent is not limited to these examples, and the solvent may be appropriately selected in accordance with physical properties of the image-forming layer. These solvents are used alone or in the form of a mixture thereof. The concentration of the aforementioned respective components (all solid contents including the additives) in the solvent preferably ranges from 1 to 50% by mass.

The application amount (of all the solid contents) on the substrate after the composition is applied and dried varies depending on the use. Regarding a lithographic printing plate precursor, in general, the application amount preferably ranges from 0.5 to 5.0 g/m². As the application amount is smaller, the apparent sensitivity increases, however the membrane property of the photosensitive layer becomes impaired. The composition of the present invention applied on the substrate is usually dried by heating. in order to dry within a short time, the drying step may be carried out for 10 seconds to 10 minutes at 30 to 150° C. using a hot-air dryer or an infrared dryer.

The method of the application may be any one selected from various methods, including roll coating, dip coating, air knife coating, gravure coating, gravure offset coating, hopper coating, blade coating, wire doctor coating, and spray coating.

Other Layers

The lithographic printing plate precursor of the invention may appropriately include not only the image-forming layer, but also other layers such as a base layer, an overcoat layer and a back coat layer in accordance with a desired purpose. Preferred examples of the back coat layer include coat layers made of an organic polymer compound described in JP-A-H05-45885 and coat layers made of a metal oxide obtained by hydrolyzing and polycondensing an organic or inorganic metal compound, described in JP-A-H06-35174. Among these coat layers, particularly preferred is the coat layer made of the metal oxide obtained from an alkoxyl compound of silicon, such as $Si(OCH_3)_4 Si(OC_2H_5)_4$ or $Si(OC_3H_7)_4$ or $Si(OC_4H_9)_4$, which is inexpensive and easily available, because the coat layer is excellent in development resistance.

Substrate

As the substrate used in the present invention, any substrate can be used as long as the substrate has required properties such as strength, durability and flexibility, required for use in the photosensitive lithographic printing plate.

Examples of the substrate include metal plates such as aluminum, zinc, copper, stainless steel, and iron plates; plastic films such as polyethylene terephthalate, polycarbonate, polyvinyl acetal, and polyethylene films; composite materials obtained by vacuum-depositing or laminating a metal layer on paper or plastic films on which a synthetic resin is melt-coated or a synthetic resin solution is coated; and materials used as the support of the printing plate. Among these substrates, an aluminum substrate and a composite substrate coated with aluminum are preferably used.

The surface of the aluminum substrate is preferably subjected to surface treatment for the purpose of enhancing water retention and improving adhesion with the photosensitive layer. Examples of the surface treatment include surface-roughening treatments such as brush polishing, ball polishing, electrolytic etching, chemical polishing, liquid honing, sand blasting, and a combination thereof. Among these surface treatments, a surface-roughening treatment including the use of electrolytic etching is preferable.

As the electrolytic bath used in the electrolytic etching, an aqueous solution containing an acid, alkali or a salt thereof, or an aqueous solution containing an organic solvent is used. Among these, an electrolytic solution containing hydrochloric acid, nitric acid, or a salt thereof is preferable.

The aluminum substrate subjected to the surface-roughening treatment is subjected to desmutting using an aqueous solution of an acid or alkali, if necessary. The aluminum substrate thus obtained is preferably subjected to an anodizing treatment. An anodizing treatment of treating in a bath containing sulfuric acid or phosphoric acid is particularly preferable.

The aluminum substrate is preferably subjected to a hydrophilization treatment after being subjected to the surface-roughening treatment (graining treatment) and anodizing treatment. The hydrophilization treatment can be conducted by dipping of an aluminum substrate in hot water or a hot water solution containing an inorganic or organic salt, sealing treatment with steam bath, silicate treatment (sodium silicate, or potassium silicate), potassium fluorozirconate treatment, phosphomolybdate treatment, alkyl titanate treatment, polyacrylic acid treatment, polyvinylsulfonic acid treatment, polyvinylphosphonic acid treatment, phytic acid treatment, treatment with a salt of hydrophilic organic polymer compound and divalent metal, hydrophilization treatment by undercoating with a water-soluble polymer having an sulfonic acid group, coloring treatment with an acidic dye, or electrodeposition with silicate.

The lithographic printing plate precursor of the invention can be prepared as described above.

Exposure and Development

The lithographic printing plate precursor of the present invention is imagewise exposed to light in accordance with properties of respective image-forming layers thereof. Specific examples of the method of the exposure include light irradiation, such as irradiation of infrared ray with infrared laser, irradiation of ultraviolet ray with an ultraviolet laser or an ultraviolet lamp, irradiation of visible ray; electron beam irradiation such as γ-ray radiation; and thermal energy application with a thermal head, a heat roll, a heating zone using a non-contact type heater or hot wind, or the like. The photosensitive lithographic printing plate of the present invention can be used as a so-called computer-to-plate (CTP) plate capable of directly writing images on a plate, using a laser, based on digital image information from a computer. It is also possible to write images by a method using as a GLV (Grafting Light Valve) or a DMD (Digital Mirror Device) as digital image writing means.

As a light source laser for exposure of the photosensitive lithographic printing plate of the present invention, a high-output laser having a maximum intensity within the near infrared or the infrared range is most preferably used. Examples of the high-output laser having a maximum intensity within a near infrared or infrared range include various lasers having a maximum intensity within a near infrared or infrared range of 760 nm to 3,000 nm, and in particular, 760 nm to 1,200 nm, for example, semiconductor laser and YAG laser. If necessary, a development treatment may be conducted after writing images on the photosensitive layer using laser and heat-treating in a heat oven.

The photosensitive lithographic printing plate of the present invention is converted into a lithographic printing plate having the image area formed thereon by writing images on the photosensitive layer using laser, followed by a development treatment and removal of the non-image area using a wet method. Water or an aqueous alkali developer can be used as the developer for development treatment.

An aqueous alkali solution having the pH of 8 or higher is usually used as the aqueous developer.

Examples of the alkali agent used in the developer include inorganic alkali compounds such as sodium silicate, potassium silicate, potassium hydroxide, sodium hydroxide, lithium hydroxide, sodium, potassium or ammonium salts of secondary or tertiary phosphoric acid, sodium metasilicate, sodium carbonate, and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine, and ethylenediamine.

The content of the alkali agent in the developer is preferably within a range from 0.005 to 10% by mass, and particularly preferably from 0.05 to 5% by mass. The content of the alkali agent in the developer of less than 0.005% by mass is not preferable because the development may not be carried out sufficiently. The content of more than 10% by mass is not preferable because an adverse influence such as corrosion of the image portion is exerted on development.

An organic solvent can also be added to the developer. Examples of the organic solvent, which can be added to the developer, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride, and monochlorobenzene. When the organic solvent is added to the developer, the content of the organic solvent is preferably 20% by mass or less, and particularly preferably 10% by mass or less.

If necessary, it is also possible to add, to the aforementioned developer, water-soluble sulfites such as lithium sulfite, sodium sulfite, potassium sulfite, and magnesium sulfite; hydroxyaromatic compounds such as an alkali-soluble pyrazolone compound, an alkali soluble thiol compound, and methyl resorcin; water softeners such as polyphosphate and aminopolycarboxylic acids; various surfactants, for example, anionic, nonionic, cationic, amphoteric and fluorine-based surfactants such as sodium isopropylnaphthalene sulfonate, sodium n-butylnaphthalene sulfonate, sodium N-methyl-N-pentadecylaminoacetate, and sodium lauryl sulfate; and various defoamers. Furthermore, the developer may contain colorants, plasticizers, chelating agents, and stabilizers.

As the developer, commercially available developers for a negative or positive type PS plate can be used. Specifically, a solution prepared by diluting a commercially available concentrated developer for a negative or positive type PS plate 1 to 1,000 times can be used as the developer in the present invention.

The processless type photosensitive lithographic printing plate of the present invention can be developed with water according to characteristics of the photosensitive layer. Therefore, after writing images on the photosensitive layer using laser and directly mounting to a printing machine without being subjecting to a conventional development treatment with a strong alkali developer, dampening water is fed to the lithographic printing plate on the printing machine. Thereby, it is possible to develop with the dampening water.

The temperature of the developer is preferably within a range from 5 to 90° C., and particularly preferably from 10 to 50° C. The dipping time is preferably within a range from 1 second to 5 minutes. If necessary, the surface can be slightly rubbed during the development.

After the completion of the development treatment, the lithographic printing plate is washed with water and/or subjected to a treatment with an aqueous desensitizing agent. Examples of the aqueous desensitizing agent include aqueous solutions of water-soluble natural polymers such as gum arabic, dextrin, and carboxymethylcellulose, and aqueous solutions of water-soluble synthetic polymers such as polyvinyl alcohol, polyvinyl pyrrolidone, and polyacrylic acid. If necessary, acids or surfactants are added to these aqueous desensitizing agents. After subjecting to a treatment with the desensitizing agent, the lithographic printing plate is dried and then used for printing as a printing plate.

Rigid images can be obtained by a heat treatment after development. The heat treatment is preferably carried out at a temperature within a range from 70° C. to 300° C. Preferable heating time varies depending on the heating temperature and ranges from about 10 seconds to 30 minutes.

As described above, the lithographic printing plate precursor of the present invention is capable of recording images by scanning exposure based on digital signals, and the recorded images can be developed with water or an aqueous developer. Alternatively, printing can be conducted by mounting the printing plate to a printing machine without being subjected to a development treatment.

On the other hand, in the case of the composition of the present invention being non-photosensitive, the composition of the present invention may be blended in a protecting layer which can be provided on an image-forming layer in a lithographic printing plate precursor with a photopolymer type image-forming layer. Therefore, in one mode of the lithographic printing plate precursor of the present invention, a protecting layer containing the aforementioned non-photosensitive composition may be provided on an image-forming layer.

In addition, in the case of the composition of the present invention being non-photosensitive, the composition of the present invention may be blended in a non-image-forming layer of a dummy plate which is fit on the part requiring no printing of a plate cylinder of a printing apparatus. Therefore, the dummy plate of the present invention can comprise a substrate and a non-image-forming layer containing the non-photosensitive composition for a lithographic printing plate of the present invention on the substrate.

The dummy plate of the present invention can be produced via the same steps as those of the lithographic printing plate precursor. In addition, the dummy plate can be used by fitting on the part requiring no printing, together with the lithographic printing plate fitted on the part requiring printing, in an offset printing machine.

EXAMPLES

The present invention will be described in more detail by way of examples, which however should not be construed as limiting the scope of the present invention. In the examples, "%" indicates % by weight.
Positive Type CTP Plate Synthesis of a Fluoro Group-Containing Copolymer Fluoro group-containing copolymers were synthesized using the monomers shown in Table 1 and Table 2 in the composition ratios shown in Table 3 and Table 4, in accordance with the methods of each of the Synthesis Examples.

Synthesis Examples 1 to 4 and Comparative Synthesis Example 1

In a four-necked round bottom flask with a volume of 300 mL, equipped with a cooling tube, a thermometer, a nitrogen-introducing tube, and a stirrer, 93.33 g of methyl isobutyl ketone was placed under nitrogen stream. The corresponding monomers (total weight=40.0 g) and 0.4 g of azoisobutyronitrile were added thereto. The mixture was heated to 90° C. while being stirred. After the mixture was stirred for 3 hours at 90° C., 0.4 g of azoisobutyronitrile was added thereto. The mixture was further stirred for 3 hours at 90° C. Subsequently, the reaction mixture was cooled to room temperature, and 26.67 g of methyl isobutyl ketone was added thereto. Subsequently, the reaction product was taken therefrom. Thereby, a 25% solution of a fluoro group-containing copolymer was obtained.

Synthesis Examples 5 to 10

In a four-necked round bottom flask with a volume of 300 mL, equipped with a cooling tube, a thermometer, a nitrogen-introducing tube, and a stirrer, 110.8 g of methyl isobutyl ketone was placed under nitrogen stream. The corresponding monomers (total weight=35.0 g) were added thereto. The mixture was heated to 50° C. while being stirred. After the monomers were dissolved, 0.32 g of azoisobutyronitrile was added thereto, and the mixture was heated to 90° C. The mixture was stirred for 3 hours at 90° C. Subsequently, 0.32 g of azoisobutyronitrile was added thereto. The mixture was further stirred for 3 hours at 90° C. Subsequently, the reaction mixture was cooled to room temperature, and 29.2 g of methyl ethyl ketone was added thereto. Subsequently, the reaction product was taken therefrom. Thereby, a 20% solution of a fluoro group-containing copolymer was obtained.

TABLE 1

| Chemical formula | Compound name | Abbreviation |
|---|---|---|
| $H_2C=CH-C(=O)-O-CH_2CH_2(CF_2)_5CH_2(CF_2)_4F$ | 3,3,4,4,5,5,6,6,7,7,9,9,9,10,10,11,11,12,12,12-nonadecafluoro dodecylacrylate | A |
| $H_2C=CH-C(=O)-O-(C_3H_6O)_n-H$, $n \approx 6$ | Polyoxypropylene acrylate | B |
| $H_2C=CH-C(=O)-O-(C_2H_4O)_n-H$, $n \approx 10$ | Polyoxyethylene acrylate | C |
| $H_2C=C(CH_3)-C(=O)-O-(C_3H_6O)_n-H$, $n \approx 9$ | Polyoxypropylene methacrylate | D |

TABLE 1-continued

| Chemical formula | Compound name | Abbreviation |
| --- | --- | --- |
| $H_2C=C(CH_3)-C(=O)-O-(C_2H_4O)_n-H$, $n \fallingdotseq 8$ | Polyoxyethylene methacrylate | E |
| $H_2C=CH-C(=O)-O-CH_2CH_2(CF_2CF_2)_3CF_2CF_3$ | 2-perfluorooctylethyl acrylate | F |

TABLE 2

| Chemical formula | Chemical name | Abbreviation |
| --- | --- | --- |
| (N-phenylmaleimide structure) | N-phenylmaleimide | G |
| (N-cyclohexylmaleimide structure) | N-cyclohexylmaleimide | H |
| (N-laurylmaleimide structure, $C_{12}H_{25}$) | N-laurylmaleimide | I |
| $H_2C=C(CH_3)-C(=O)-O-CH_2-C_6H_5$ | Benzyl methacrylate | J |
| $H_2C=CH-C(=O)-O-C_{11}H_{22}-CH_3$ | Lauryl acrylate | K |
| (styrene structure) | Styrene | L |

TABLE 2-continued

| Chemical formula | Chemical name | Abbreviation |
|---|---|---|
| H₂C=C(CH₃)-C(=O)-O-C₂H₄-OH | 2-hydroxyethyl methacrylate | M |

TABLE 3

Monomer composition ratio of fluoro group-containing copolymer (% by weight)

| | A | B | C | D | E | F | Total |
|---|---|---|---|---|---|---|---|
| Synthesis Example 1 | 34.0 | 66.0 | — | — | — | — | 100.0 |
| Synthesis Example 2 | 34.0 | — | 66.0 | — | — | — | 100.0 |
| Synthesis Example 3 | 34.0 | — | — | 66.0 | — | — | 100.0 |
| Synthesis Example 4 | 34.0 | — | — | — | 66.0 | — | 100.0 |
| Comparative Synthesis Example 1 | — | 66.0 | — | — | — | 34.0 | 100.0 |

TABLE 4

Monomer composition ratio of fluoro group-containing copolymer (% by weight)

| | A | G | H | I | J | K | L | M | Total |
|---|---|---|---|---|---|---|---|---|---|
| Synthesis Example 5 | 28.0 | 40.0 | — | — | 13.0 | — | — | 19.0 | 100.0 |
| Synthesis Example 6 | 34.5 | 40.0 | — | — | 6.5 | — | — | 19.0 | 100.0 |
| Synthesis Example 7 | 34.5 | — | 40.0 | — | 6.5 | — | — | 19.0 | 100.0 |
| Synthesis Example 8 | 34.5 | — | — | 40.0 | 6.5 | — | — | 19.0 | 100.0 |
| Synthesis Example 9 | 34.5 | 40.0 | — | — | — | 6.5 | — | 19.0 | 100.0 |
| Synthesis Example 10 | 34.5 | 40.0 | — | — | — | — | 6.5 | 19.0 | 100.0 |

Positive Type CTP Plate
Example of Image-Forming Layer of a Single Layer

Preparation of Aluminum Substrate 1

An aluminum plate having a thickness of 0.24 mm was degreased with an aqueous solution of sodium hydroxide, and subsequently subjected to an electrolytic roughening treatment in a 2% aqueous solution of hydrochloric acid. Thereby, a grained plate having a center line average roughness Ra of 0.5 μm was obtained. Furthermore, the obtained grained plate was subjected to an anodizing treatment in a 20% aqueous solution of sulfuric acid with current density of 2 A/dm², to form 2.7 g/m² of an oxide film thereon. The anodized aluminum plate was dipped in a 2.5% aqueous solution of sodium silicate at 70° C. for 30 seconds, and subsequently, washed with water and then dried. Thereby, an aluminum substrate 1 was obtained.

Image-Forming Layer

On the aforementioned aluminum substrate 1 obtained as described above, a coating solution 1 shown in Table 5 was applied using a bar coater at a low speed, followed by drying for 40 seconds at 135° C. and further slowly cooling to the temperature ranging from 20° C. to 26° C. Thereby, a photosensitive lithographic printing plate was obtained. The amount of the dried coating film at this time was 1.2 g/m².

TABLE 5

Coating solution 1

| Components | Amount (g) |
|---|---|
| Copolymer of acrylonitrile/methacrylic acid/methacrylamide (weight ratio: 59/15/26, Mw = 50,000) | 4.05 |
| m/p-Cresol novolak resin (m/p = 6.4, Mw = 7,500) | 1.59 |
| Infrared absorbing dye of the following Chemical Formula 1 | 0.17 |
| Crystal Violet (manufactured by HODOGAYA CHEMICAL Co., Ltd.) | 0.35 |
| Fluoro group-containing copolymer (solid content) | 0.10 |
| Methyl cellosolve | 44.80 |
| Methyl ethyl ketone | 23.58 |
| Tetrahydrofuran | 23.58 |
| Distilled water | 1.78 |

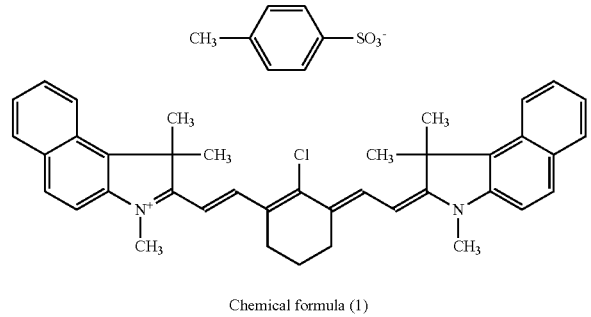

Chemical formula (1)

Examples 1 to 10

Examples 1 to 10 respectively used photosensitive compositions using the fluoro group-containing copolymers of Synthesis Examples 1 to 10, as the "fluoro group-containing copolymer" in the coating solution 1 shown in Table 5.

Example 11

Example 11 used a photosensitive composition obtained by mixing the fluoro group-containing copolymer of Synthesis Example 1 and the fluoro group-containing copolymer of Synthesis Example 6 in a ratio of 1:1, as the "fluoro group-containing copolymer" in the coating solution 1 shown in Table 5.

Comparative Examples 1 and 2

Comparative Example 1 used a photosensitive composition which was free from the "fluoro group-containing copolymer" in the coating solution 1 shown in Table 5. In addition, Comparative Example 2 used a photosensitive composition using the conventional fluoro group-containing copolymer obtained in Comparative Synthesis Example 1, as the "fluoro group-containing copolymer" in the coating solution 1 shown in Table 5.

Example of an Image-Forming Layer of Double Layer

Preparation of Aluminum Substrate 2

An aluminum plate having a thickness of 0.24 mm was degreased with an aqueous solution of sodium hydroxide, and subsequently subjected to an electrolytic roughening treatment in a 2% aqueous solution of hydrochloric acid. Thereby, a grained plate having a center line average roughness Ra of 0.5 μm was obtained. Furthermore, the obtained grained plate was subjected to an anodizing treatment in a 20% aqueous solution of sulfuric acid with current density of 2 A/dm$^2$, to form 2.7 g/m$^2$ of an oxide film thereon. The anodized aluminum plate was dipped in 0.55 g/L of an aqueous solution of PVPA at 60° C. for 10 seconds, and subsequently, washed with water and then dried. Thereby, an aluminum substrate 2 was obtained.

Image-Forming Layer

On the aforementioned aluminum substrate 2 obtained as described above, a coating solution 2 for a lower layer shown in Table 6 was applied using a bar coater at a low speed, followed by drying for 40 seconds at 130° C. and further slowly cooling to 35° C. The amount of the dried coating film at this time was 1.3 g/m$^2$. Subsequently, a coating solution 3 for an upper layer shown in Table 7 was applied thereon using a bar coater at a low speed, followed by drying for 40 seconds at 130° C. and further slowly cooling to the temperature ranging from 20° C. to 26° C. Thereby, a photosensitive lithographic printing plate was obtained. The amount of the dried coating film at this time was 0.6 g/m$^2$.

TABLE 6

| Coating solution 2 for a lower layer | |
|---|---|
| Components | Amount (g) |
| Copolymer of acrylonitrile/methacrylic acid/methacrylamide/styrene (weight ratio: 50/10/25/15, Mw = 35.000) | 5.47 |
| Infrared absorbing dye of the following Chemical Formula 1 | 0.40 |
| Crystal Violet (manufactured by HODOGAYA CHEMICAL Co., Ltd.) | 0.09 |
| 4-Dimethylaminobenzoic acid | 0.22 |
| 8019 ADDITIVE (silicone surfactant; manufactured by DOW CORNING TORAY Co., Ltd.) (solid content) | 0.09 |
| Methyl ethyl ketone | 61.00 |
| Propylene glycol monomethyl ether | 14.00 |

TABLE 6-continued

| Coating solution 2 for a lower layer | |
|---|---|
| Components | Amount (g) |
| γ-Butyrolactone | 9.40 |
| Distilled water | 9.34 |

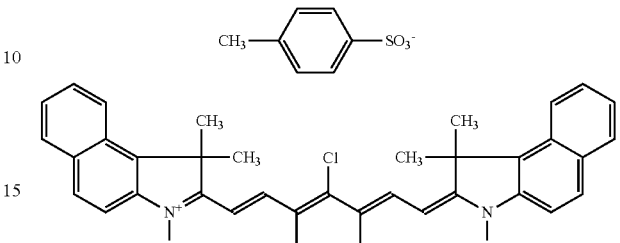

Chemical formula (1)

TABLE 7

| Coating solution 3 for an upper layer | |
|---|---|
| Components | Amount (g) |
| Copolymer of dimethylol propionic acid/bis(4-(2-hydroxyethoxy)phenyl)sulfone/1,10-decanediol/diphenylmethane diisocyanate (weight ratio: 20/18/14/48, Mw = 16,000) | 3.65 |
| Crystal Violet (manufactured by HODOGAYA CHEMICAL Co., Ltd.) | 0.03 |
| 4-Dimethylaminobenzoic acid | 0.28 |
| Fluoro group-containing copolymer (solid content) | 0.04 |
| Methyl ethyl ketone | 43.20 |
| Propylene glycol monomethyl ether | 43.20 |
| Propylene glycol monomethyl ether 2-acetate | 9.60 |

Examples 12 to 21

Examples 12 to 21 respectively used photosensitive compositions using the fluoro group-containing copolymers of Synthesis Examples 1 to 10, as the "fluoro group-containing copolymer" in the coating solution 1 shown in Table 3.

Example 22

Example 22 used a photosensitive composition obtained by mixing the fluoro group-containing copolymer of Synthesis Example 1 and the fluoro group-containing copolymer of Synthesis Example 6 in a ratio of 1:1, as the "fluoro group-containing copolymer" in the coating solution 3 shown in Table 7.

Comparative Examples 3 and 4

Comparative Example 3 used a photosensitive composition which was free from the "fluoro group-containing copolymer" in the coating solution 1 shown in Table 7. In addition, Comparative Example 4 used a photosensitive composition using the conventional fluoro group-containing copolymer obtained in Comparative Synthesis Example 1, as the "fluoro group-containing copolymer" in the coating solution 1 shown in Table 7.

Image-forming layer of a single layer

Each of the obtained photosensitive lithographic printing plates was provided to a PT-R4300 plate setter (manufactured by Dainippon Screen Ltd.), and exposed with energy of 120 mJ/cm$^2$. Subsequently, each of the exposed photosensitive lithographic printing plates was developed with a developer PD1 (1+8) (manufactured by Kodak Japan Ltd.) using a processor PK-910II (manufactured by Kodak Japan Ltd.). The aforementioned development treatment was carried out under the conditions of 30° C. for 15 seconds. A finishing gum PF-2 (1+1.5) (manufactured by Kodak Japan Ltd.) was applied thereon. Each of the obtained lithographic printing plates was mounted to a printing press Roland R-201 and then initial ink receptivity was evaluated. The results are shown in Table 8.

Image-Forming Layer of Double Layer

Each of the obtained photosensitive lithographic printing plates was provided to a PT-R4300 plate setter (manufactured by Dainippon Screen Ltd.), and exposed with energy of 120 mJ/cm$^2$. Subsequently, each of the exposed photosensitive lithographic printing plates was developed with a developer SW-D1 (1+4) (manufactured by Kodak Japan Ltd.) using a processor P-940X (manufactured by Kodak Japan Ltd.). The aforementioned development was carried out under the conditions of 30° C. for 15 seconds. A finishing gum PF-2 (1+1.5) (manufactured by Kodak Japan Ltd.) was applied thereon. Each of the obtained lithographic printing plates was mounted to a printing press Roland R-201 and then initial ink receptivity was evaluated. The results are shown in Table 9.

Evaluation Methods

Ink Receptivity

The lithographic printing plates after application of the finishing gum were left for a week. At printing start, printing sheets were counted until ink was perfectly transferred on the printing sheet. The ink receptivity was evaluated by the number of printing sheets.

Uniformity of the Coating Film

Visual observation was carried out regarding uneven tone caused by drying wind or the like, occurrences of streaks caused during application and during drying, and the like. The uniformity of the coating film was evaluated by the following three levels: ○ (without uneven application); Δ (with partial uneven application); and x (with allover uneven application).

High Speed Coating Property

Visual observation regarding streaks or white spots caused by foam generated by the fluoro group-containing copolymers when a bar coater application was carried out at a high speed corresponding to 70 m/min. The high speed coating property was evaluated by the following three levels: ○ (none defect); Δ (partial defect); and x (allover defect).

Defoaming Property

The photosensitive composition using each of the fluoro group-containing copolymers, in an amount of 25 mL, was placed in a sample bottle with a volume of 50 mL, with a stopper, and shaken vigorously three times. Subsequently, the bottle was allowed to stand, and the time was counted until generated foam had completely disappeared.

TABLE 8

Image-forming layer of a single layer

|  | Fluoro group-containing copolymer | Ink receptivity (sheets) | Uniformity of coating film | High speed coating property | Defoaming Property |
|---|---|---|---|---|---|
| Example 1 | Synthesis Example 1 | 13 | ○ | ○ | 2 min. 28 sec. |
| Example 2 | Synthesis Example 2 | 16 | ○ | ○ | 2 min. 20 sec. |
| Example 3 | Synthesis Example 3 | 15 | ○ | ○ | 2 min. 50 sec. |
| Example 4 | Synthesis Example 4 | 16 | ○ | ○ | 2 min. 32 sec. |
| Example 5 | Synthesis Example 5 | 13 | ○ | ○ | 3 min. 33 sec. |
| Example 6 | Synthesis Example 6 | 7 | ○ | Δ | 4 min. 25 sec. |
| Example 7 | Synthesis Example 7 | 7 | ○ | Δ | 4 min. 30 sec. |
| Example 8 | Synthesis Example 8 | 11 | ○ | Δ | 4 min. 57 sec. |
| Example 9 | Synthesis Example 9 | 10 | ○ | Δ | 4 min. 42 sec. |
| Example 10 | Synthesis Example 10 | 10 | ○ | Δ | 4 min. 26 sec. |
| Example 11 | Synthesis Example 1/ Synthesis Example 6 = 1/1 | 9 | ○ | ○ | 3 min. 15 sec. |
| Comparative Example 1 | None | 35 | x | ○ | 25 sec. |
| Comparative Example 2 | Comparative Synthesis Example 1 | 19 | ○ | x | ≥10 min. |

TABLE 9

Image-forming layer of double layer

|  | Fluoro group-containing copolymer Upper layer | Ink receptivity (sheets) | Uniformity of coating film | High speed coating property | Defoaming property |
|---|---|---|---|---|---|
| Example 12 | Synthesis Example 1 | 12 | ○ | ○ | 1 min. 58 sec. |

TABLE 9-continued

Image-forming layer of double layer

|  | Fluoro group-containing copolymer Upper layer | Ink receptivity (sheets) | Uniformity of coating film | High speed coating property | Defoaming property |
|---|---|---|---|---|---|
| Example 13 | Synthesis Example 2 | 18 | ○ | ○ | 2 min. |
| Example 14 | Synthesis Example 3 | 12 | ○ | ○ | 2 min. 5 sec. |
| Example 15 | Synthesis Example 4 | 17 | ○ | ○ | 2 min. 2 sec. |
| Example 16 | Synthesis Example 5 | 12 | ○ | ○ | 3 min. 10 sec. |
| Example 17 | Synthesis Example 6 | 6 | ○ | Δ | 4 min. 5 sec. |
| Example 18 | Synthesis Example 7 | 6 | ○ | Δ | 4 min. |
| Example 19 | Synthesis Example 8 | 9 | ○ | Δ | 4 min. 30 sec. |
| Example 20 | Synthesis Example 9 | 9 | ○ | Δ | 4 min. 10 sec. |
| Example 21 | Synthesis Example 10 | 10 | ○ | Δ | 4 min. 12 sec. |
| Example 22 | Synthesis example 1/ Synthesis example 6 = 1/1 | 7 | ○ | ○ | 2 min. 50 sec. |
| Comparative Example 3 | None | 30 | x | ○ | 18 sec. |
| Comparative Example 4 | Comparative Synthesis Example 1 | 20 | ○ | x | ≥10 min. |

As is apparent from the aforementioned Examples and Comparative Examples, the high speed coating properties of the photosensitive lithographic printing plates of the present invention using the specific fluoro group-containing copolymers were at the equivalent level to that of the photosensitive lithographic printing plates using none of the fluoro group-containing copolymers (Comparative Examples 1 and 3), and were remarkably superior as compared with that of the photosensitive lithographic printing plates using the conventional fluoro group-containing copolymers (Comparative Examples 2 and 4). In addition, Comparative Examples 1 and 3 used none of the fluoro group-containing copolymers, and for this reason, there were problems in view of uniformity of the coating film. On the other hand, the photosensitive lithographic printing plates of the present invention exhibited uniformity of the coating film equivalent to that of the photosensitive lithographic printing plates (Comparative Examples 2 and 4) using the conventional fluoro group-containing copolymer formed in Comparative Synthesis Example 1, and provided improvements in ink receptivity. In particular, the lithographic printing plates of Examples 11 and 22, using a mixture of the fluoro group-containing copolymers of Synthesis Example 1 and Synthesis Example 6 had both superior uniformity of the coating film and superior high speed coating properties, and also exhibited good ink receptivity.

In addition, it could be confirmed that as shown in Examples 1 to 22, in the photosensitive compositions using the fluoroalkyl group-containing copolymers having hydrogen atoms at the specified positions, foam easily disappeared, and it was difficult for streaks and white spots caused by the foam during high speed coating to occur; and in contrast, as shown in Comparative Example 2, in the photosensitive composition using the conventional type of the fluoro group-containing copolymer obtained in Comparative Synthesis Example 1, it was difficult to defoam, and streaks and white spots caused by foam during high speed coating frequently occurred.

Negative Type CTP Plate

Synthesis of a Fluoro Group-Containing Copolymer

Fluoro group-containing copolymers were synthesized by means of the methods described in Synthesis Examples described below by using the monomers shown in Table 1 and Table 2 in the composition ratios shown in Table 10.

Synthesis Examples 11 to 19 and Comparative Synthesis Example 2

In a four-necked round bottom flask with a volume of 300 mL, equipped with a cooling tube, a thermometer, a nitrogen-introducing tube, and a stirrer, 128.8 g of methyl isobutyl ketone was placed under nitrogen stream. 15.05 g of monomer A, 17.90 g of monomer G and 7.73 g of monomer M were added thereto, and the mixture was heated to 50° C. The monomers were dissolved, and subsequently, 0.37 g of azoisobutyronitrile was added thereto, and the mixture was heated to 90° C. while stirring. The mixture was further stirred for 3 hours at 90° C. Subsequently, the reaction mixture was cooled to room temperature, and supplying nitrogen was stopped. Subsequently, air was blown into the system. Hydroxyquinone monomethyl ether was added to the reaction solution, and the mixture was heated to 70° C. 9.01 g of 2-isocyanate ethyl methacrylate ("MOI", manufactured by Showa Denko K. K.), 0.150 g of dibutyl tin dilaurate, and 20.26 g of methyl isobutyl ketone were added thereto. The mixture was heated to 90° C., and stirred for 3 hours while the temperature was maintained at 90° C. Subsequently, the mixture was cooled to room temperature. Thereby, a 25% solution of a fluoro group-containing copolymer was obtained.

TABLE 10

| | Monomer composition of fluoro group-containing copolymer (% by weight) | | | | | |
|---|---|---|---|---|---|---|
| | A | F | G | M | MOI | Total |
| Synthesis Example 11 | 27.8 | — | 37.3 | 16.1 | 18.8 | 100.0 |
| Synthesis Example 12 | 29.1 | — | 36.7 | 15.8 | 18.5 | 100.0 |
| Synthesis Example 13 | 30.3 | — | 36.0 | 15.6 | 18.1 | 100.0 |
| Synthesis Example 14 | 31.5 | — | 35.4 | 15.3 | 17.8 | 100.0 |
| Synthesis Example 15 | 32.7 | — | 34.8 | 15.0 | 17.5 | 100.0 |
| Synthesis Example 16 | 35.0 | — | 33.6 | 14.5 | 16.9 | 100.0 |
| Synthesis Example 17 | 37.2 | — | 32.4 | 14.0 | 16.3 | 100.0 |
| Synthesis Example 18 | 39.4 | — | 31.3 | 13.5 | 15.8 | 100.0 |
| Synthesis Example 19 | 41.4 | — | 30.3 | 13.1 | 15.2 | 100.0 |
| Comparative Synthesis Example 2 | — | 30.3 | 36 | 15.6 | 18.1 | 100.0 |

Image-Forming Layer

On the aforementioned aluminum substrate 2, a coating solution 4 for a lower layer shown in Table 11 was applied using a bar coater at a low speed, followed by drying for 40 seconds at 110° C. and further slowly cooling to 35° C. The amount of the dried coating film at this time was 1.4 g/m². Subsequently, a coating solution 5 for an upper layer shown in Table 12 was applied thereon using a bar coater at a low speed, followed by drying for 40 seconds at 110° C. and further slowly cooling to the temperature ranging from 20° C. to 26° C. Thereby, a photosensitive lithographic printing plate was obtained. The amount of the dried coating film at this time was 0.6 g/m². The fluoro group-containing copolymers in Table 11 were evaluated by replacing with various copolymers shown in Tables 3, 4 and 10, in order to compare the characteristics thereof.

TABLE 11

| Coating solution 4 for a lower layer | |
|---|---|
| Name | Amount (g) |
| NPP-33 | 2.020 |
| ACA 230AA | 3.813 |
| IR dye of Chemical Formula (1) shown below | 0.270 |
| DPHA | 2.847 |
| Dye B | 0.264 |
| MDP | 0.075 |
| TAZ-104 | 0.155 |
| P3B | 0.096 |
| Fluoro group-containing copolymer (solid content) | 0.026 |
| Propylene glycol monomethyl ether | 30.700 |
| Methyl ethyl ketone | 59.734 |

TABLE 11-continued

Coating solution 4 for a lower layer

Name — Amount (g)

Chemical formula (1)

NPP-33: Polymer consisting of 40% by weight of allyl methacrylate, 30% by weight of acrylonitrile and 30% by weight of p-(N-methacrylamino) benzoic acid ACA 230AA: Polymer having carboxyl groups which are partially modified with 3,4-epoxy-cyclohexyl methacrylate (see the following chemical formula)

DPHA: Dipentaerythritol hexaacrylate (see the following chemical formula)

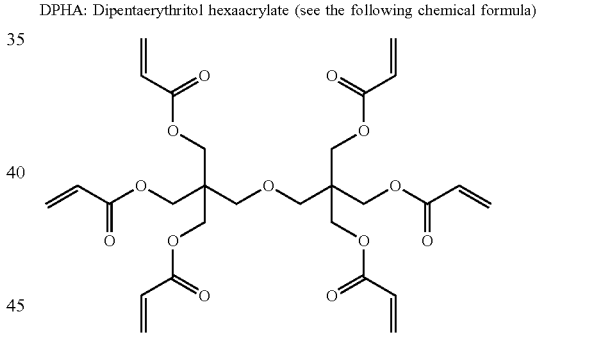

Dye B: Blue coloring dye represented by the following chemical formula:

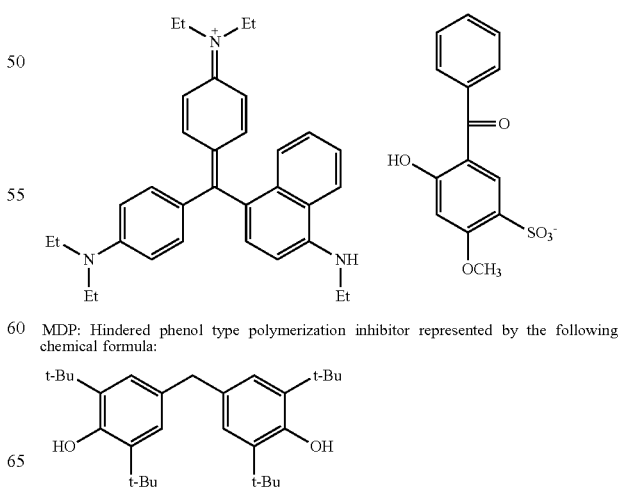

MDP: Hindered phenol type polymerization inhibitor represented by the following chemical formula:

TABLE 11-continued

Coating solution 4 for a lower layer

| Name | Amount (g) |
|---|---|

TAZ-104: 2-(Methoxyphenyl)-4,6-bis(trichloromethyl)-s-triazine represented by the following chemical formula:

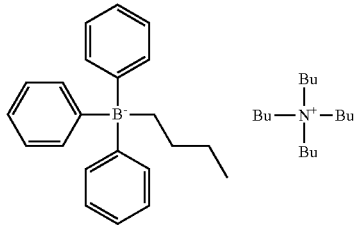

P3B: Tetrabutylammonium triphenylbutyl borate

TABLE 12

Coating solution 5 for an upper layer

| Name | Amount (g) |
|---|---|
| PVA-203 | 1.798 |
| VPC55K65W | 0.665 |
| Newcol 2305 | 0.066 |

TABLE 12-continued

Coating solution 5 for an upper layer

| Name | Amount (g) |
|---|---|
| Newcol 2320 | 0.134 |
| Sodium p-toluenesulfonate | 0.100 |

TABLE 12-continued

Coating solution 5 for an upper layer

| Name | Amount (g) |
|---|---|
| TECHPOLYMER SSX-105 | 0.115 |
| Deionized water | 97.123 |

PVA-203: Polyvinylalcohol (saponification value = 88%, degree of polymerization = 300)
LUVITEC VPC55K65W: Copolymer of N-vinyl pyrrolidone and vinyl caprolactam, manufactured by BASF Corporation
Newcol 2305/2320: Nonionic surfactant which is a mixture of C = 12 and C = 13 compounds (see the following chemical formulae).

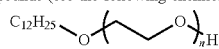

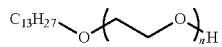

Newcol 2305: n = 5, Newcol 2320: n = 20

TECHPOLYMER SSX-105: Mono-dispersion, highly cross-linked polymethyl methacrylate particle with a particle size of 5 μm.

Each of the obtained photosensitive lithographic printing plates was provided to a Magnus 800 plate setter (manufactured by Kodak Japan Ltd.), and exposed with energy of 90 mJ/cm². Subsequently, each of the exposed photosensitive lithographic printing plates was developed with a developer TN-D1 (1+3.5) (manufactured by Kodak Japan Ltd.) using a processor PK-1310NEWS (manufactured by Kodak Japan Ltd.). The aforementioned development was carried out under the conditions of 30° C. for 13 seconds. A finishing gum LNF-11 (1+1) (manufactured by Kodak Japan Ltd.) was applied thereon. Each of the obtained lithographic printing plates was mounted to a printing press Roland R-201 and then initial ink receptivity was evaluated. The results are shown in Table 13.

TABLE 13

| | Fluoro copolymer | Ink receptivity | Uniformity of the image layer | High speed coating property | Defoaming property |
|---|---|---|---|---|---|
| Example 23 | Synthesis Example 1 | 13 | ○ | ○ | 2 min. 30 sec. |
| Example 24 | Synthesis Example 2 | 15 | ○ | ○ | 2 min. 44 sec. |
| Example 25 | Synthesis Example 3 | 15 | ○ | ○ | 3 min. 5 sec. |
| Example 26 | Synthesis Example 4 | 16 | ○ | ○ | 2 min. 20 sec. |
| Example 27 | Synthesis Example 5 | 15 | ○ | ○ | 2 min. 52 sec. |
| Example 28 | Synthesis Example 6 | 17 | ○ | Δ | 5 min. 7 sec. |
| Example 29 | Synthesis Example 7 | 13 | ○ | Δ | 4 min. 50 sec. |
| Example 30 | Synthesis Example 8 | 13 | ○ | Δ | 4 min. 55 sec. |
| Example 31 | Synthesis Example 9 | 15 | ○ | Δ | 4 min. 20 sec. |
| Example 32 | Synthesis Example 10 | 15 | ○ | Δ | 4 min. 22 sec. |
| Example 33 | Synthesis Example 11 | 9 | ○ | ○ | 3 min. 21 sec. |
| Example 34 | Synthesis Example 12 | 12 | ○ | ○ | 2 min. 55 sec. |
| Example 35 | Synthesis Example 13 | 10 | ○ | ○ | 3 min. 7 sec. |
| Example 36 | Synthesis Example 14 | 11 | ○ | ○ | 3 min. 14 sec. |
| Example 37 | Synthesis Example 15 | 11 | ○ | ○ | 3 min. 2 sec. |
| Example 38 | Synthesis Example 16 | 10 | ○ | ○ | 2 min. 50 sec. |
| Example 39 | Synthesis Example 17 | 12 | ○ | ○ | 2 min. 45 sec. |
| Example 40 | Synthesis Example 18 | 12 | ○ | ○ | 2 min. 47 sec. |
| Comparative Example 5 | None | 35 | x | ○ | 15 sec. |
| Comparative Example 6 | Comparative Synthesis Example 1 | 30 | ○ | x | ≥10 min. |
| Comparative Example 7 | Comparative Synthesis Example 2 | 22 | ○ | x | 8 min. 30 sec. |

As is apparent from the aforementioned Examples and Comparative Examples, the high speed coating properties of the photosensitive lithographic printing plates of the present invention using the specific fluoro group-containing copolymers had the same level as that of the photosensitive lithographic printing plate (Comparative Example 5) in which none of the fluoro group-containing copolymer was used, and exhibited superior results as compared with the results of the photosensitive lithographic printing plates (Comparative Examples 6 and 7) using the conventional fluoro group-containing copolymers obtained in Comparative Synthesis Examples 1 and 2. In addition, Comparative Example 5 had none of fluoro group-containing copolymers, and for this reason, there is a problem in uniformity of the coating film. In contrast, the photosensitive lithographic printing plate of the present invention exhibited the uniformity of the coating film equivalent to that of the photosensitive lithographic printing plates (Comparative Examples 6 and 7) using the conventional fluoro group-containing copolymers obtained in Comparative Synthesis Examples 1 and 2, and had improved ink receptivity.

In addition, as shown in Examples 23 to 41, the photosensitive compositions using the fluoroalkyl group-containing copolymers having the hydrogen atoms at the specified positions are easily defoamed, and streaks or white spots caused by foam during high speed coating hardly occurred. In contrast, as shown in Comparative Examples 6 and 7, it was confirmed that the photosensitive composition using the conventional fluoro group-containing copolymer obtained in Comparative Synthesis Example 1 or 2 was hardly defoamed, and streaks and white spots caused by foam during high speed coating occurred.

In the negative type CTP plates, fluoro group-containing polymers and fluoro-based surfactants such as Ftergent series (commercially available from NEOS Co. Ltd.), Zonyl Capstone series (commercially available from Du Pont), MEGAFACE series (commercially available from DIC Corporation) and the like are widely used. However, the aforementioned fluoro group-containing polymers and fluoro-based surfactants fail to exhibit sufficient high speed coating properties, defoaming properties, and uniformity of the coating film, as compared with the copolymers shown in Synthesis Examples 1 to 19.

For example, the photosensitive lithographic printing plates of the present invention using the fluoro group-containing copolymers of Synthesis Examples 1 to 19 can also be used as dummy plates for newspaper printing, and exhibit good high speed coating properties, defoaming properties and uniformity of the coating films. In contrast, the fluoro group-containing copolymers obtained in Comparative Synthesis Example 1 and Comparative Synthesis Example 2, as well as the aforementioned conventionally used fluoro group-containing polymers and surfactants can also be used in newspaper printing. However, the photosensitive lithographic printing plates using the same exhibit degraded properties such as high speed coating properties, defoaming properties, and uniformity of the coating films, as compared with the photosensitive lithographic printing plates of the present invention using the fluoro group-containing copolymers shown in Synthesis Examples 1 to 19.

The invention claimed is:

1. A composition for a lithographic printing plate, comprising:
a fluoroaliphatic group-containing copolymer having at least a unit represented by the following general formula:

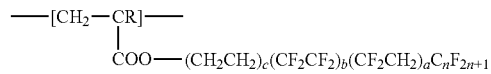

wherein
R denotes a hydrogen atom or a methyl group;
n denotes an integer from 1 to 6;
a denotes an integer from 1 to 4;
b denotes an integer from 1 to 3; and
c denotes an integer from 1 to 3.

2. The composition for a lithographic printing plate according to claim 1, wherein the fluoroaliphatic group-containing copolymer further has a unit corresponding to poly(oxyalkylene) acrylate and/or poly(oxyalkylene) methacrylate.

3. The composition for a lithographic printing plate according to claim 1, wherein the fluoroaliphatic group-containing copolymer further has a unit having an acidic hydrogen atom.

4. The composition for a lithographic printing plate according to claim 1, wherein the fluoroaliphatic group-containing copolymer further has a unit having an ethylenically unsaturated group in a side chain.

5. The composition for a lithographic printing plate according to claim 1, wherein the composition is photosensitive.

6. A lithographic printing plate precursor, comprising:
a substrate; and
an image-forming layer comprising the composition for a lithographic printing plate according to claim 1, on the substrate.

7. The lithographic printing plate precursor according to claim 6, wherein the image-forming layer comprises a photo-thermal convertor.

8. The lithographic printing plate precursor according to claim 7, wherein the image-forming layer further comprises a water-insoluble and alkaline aqueous solution-soluble or alkaline aqueous solution-dispersible resin.

9. The lithographic printing plate precursor according to claim 8, wherein the image-forming layer further comprises an acid generator.

10. The lithographic printing plate precursor according to claim 7, wherein the image-forming layer further comprises a polymerization initiator and a radical-polymerizable compound.

11. The lithographic printing plate precursor according to claim 6, wherein the image-forming layer further comprises a photo-polymerization initiator and an ethylenically unsaturated bond-containing compound.

12. The lithographic printing plate precursor according to claim 6, wherein the image-forming layer comprises a plurality of layers; and
one or more of the layers comprise a photo-thermal convertor.

13. The composition for a lithographic printing plate according to claim 1, wherein the composition is not photosensitive.

14. A dummy lithographic printing plate, comprising:
a substrate; and
a protecting layer comprising the composition for a lithographic printing plate according to claim 13, on the substrate.

* * * * *